United States Patent
Kagawa et al.

(10) Patent No.: US 12,396,368 B2
(45) Date of Patent: Aug. 19, 2025

(54) PIEZOELECTRIC ELEMENT

(71) Applicant: FUJIFILM Corporation, Tokyo (JP)

(72) Inventors: Yusuke Kagawa, Minamiashigara (JP); Teruo Ashikawa, Minamiashigara (JP); Kazuo Hiraguchi, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 798 days.

(21) Appl. No.: 17/720,499

(22) Filed: Apr. 14, 2022

(65) Prior Publication Data

US 2022/0238785 A1 Jul. 28, 2022

Related U.S. Application Data

(63) Continuation of application No. PCT/JP2020/035426, filed on Sep. 18, 2020.

(30) Foreign Application Priority Data

Oct. 15, 2019 (JP) .................... 2019-188569

(51) Int. Cl.
*H10N 30/88* (2023.01)
*H04R 17/00* (2006.01)
(Continued)

(52) U.S. Cl.
CPC ......... *H10N 30/883* (2023.02); *H04R 17/005* (2013.01); *H10N 30/02* (2023.02); *H10N 30/852* (2023.02); *H10N 30/87* (2023.02)

(58) Field of Classification Search
CPC ...... H10N 30/883; H10N 30/02; H10N 30/87; H10N 30/852; H04R 17/005
See application file for complete search history.

(56) References Cited

U.S. PATENT DOCUMENTS

2006/0131998 A1 6/2006 Aoki et al.
2016/0008852 A1* 1/2016 Miyoshi ............... H04R 17/005
310/345
(Continued)

FOREIGN PATENT DOCUMENTS

JP S59178782 A * 10/1984
JP 2002-186096 A 6/2002
(Continued)

OTHER PUBLICATIONS

Korean Office Action for corresponding Korean Application No. 10-2022-7011841, dated Dec. 14, 2023, with English translation.
(Continued)

*Primary Examiner* — Jeremy A Luks
(74) *Attorney, Agent, or Firm* — Birch, Stewart, Kolasch & Birch, LLP

(57) ABSTRACT

Provided is a piezoelectric element capable of reliably performing an electrical connection to an electrode layer. A piezoelectric element includes a piezoelectric layer, electrode layers formed on both sides of the piezoelectric layer, and a protective layer laminated on a surface of the electrode layer opposite to a surface on the polymer composite piezoelectric body side. The protective layer has a hole that penetrates from the surface to the electrode layer. The piezoelectric element further includes a filling member consisting of a conductive material, which is formed from the inside of the hole to a part of a surface of the protective layer and is electrically connected to the electrode layer, a conductive member which covers at least a part of the filling member and is electrically connected to the filling member, and a fixing member for fixing the conductive member.

19 Claims, 15 Drawing Sheets

(51) Int. Cl.
   *H10N 30/02*   (2023.01)
   *H10N 30/85*   (2023.01)
   *H10N 30/87*   (2023.01)

(56) References Cited

U.S. PATENT DOCUMENTS

2016/0014527 A1   1/2016   Miyoshi et al.
2017/0331030 A1   11/2017  Inoue et al.

FOREIGN PATENT DOCUMENTS

JP   2006-197554 A    7/2006
JP   2011-249990 A    12/2011
JP   2016-15354 A     1/2016
WO   WO 2017/030045 A1   2/2017

OTHER PUBLICATIONS

European Communication pursuant to Article 94(3) EPC for European Application No. 20876880.4, dated Nov. 15, 2023.
Japanese Office Action dated May 9, 2023 for Application No. 2021-552277 with an English translation.
International Preliminary Report on Patentability and Written Opinion of the International Searching Authority for International Application No. PCT/JP2020/035426, dated Apr. 28, 2022, with an English translation.
International Search Report for International Application No. PCT/JP2020/035426, dated Dec. 1, 2020, with an English translation.
Extended European Search Report for European Application No. 20876880.4, dated Nov. 21, 2022.

* cited by examiner

PIEZOELECTRIC ELEMENT

CROSS-REFERENCE TO RELATED APPLICATIONS

This application is a Continuation of PCT International Application No. PCT/JP2020/035426 filed on Sep. 18, 2020, which claims priority under 35 U.S.C. § 119(a) to Japanese Patent Application No. 2019-188569 filed on Oct. 15, 2019. The above application is hereby expressly incorporated by reference, in its entirety, into the present application.

BACKGROUND OF THE INVENTION

1. Field of the Invention

The present invention relates to a piezoelectric element.

2. Description of the Related Art

With reduction in thickness of displays such as liquid crystal displays or organic EL displays, speakers used in these thin displays are also required to be lighter and thinner. In addition, in flexible displays having flexibility, speakers are also required to have flexibility in order to be integrated with flexible displays without impairing lightness and flexibility. It is considered to adopt a sheet-like piezoelectric element (electroacoustic conversion film) having properties of stretching and contracting in response to an applied voltage, for such a light and thin speaker having flexibility.

As such a sheet-like piezoelectric element having flexibility, a piezoelectric element having an electrode layer and a protective layer on both sides of a piezoelectric layer is suggested.

For example, JP2016-015354A discloses an electroacoustic conversion film including a layer having a dielectric property, thin film electrodes formed on both sides of the layer having a dielectric property (piezoelectric layer), and protective layers formed on surfaces of both thin film electrodes, in which at least one of the protective layers has a thin layer portion having a film thickness thinner than that of a peripheral portion.

In such an electroacoustic conversion film, in order to apply a voltage to the electrode layer to vibrate the electroacoustic conversion film, it is necessary to make the thickness of the electrode layer extraordinarily thin. For example, a vaporized film having a thickness of 1 μm or less and the like are suitable for the electrode layer.

On the other hand, in order to mount the electroacoustic conversion film as a speaker or the like, it is necessary to pull out the electrode layer and connect a wiring here.

However, it is difficult to pull a thin electrode layer such as the vaporized film out of a plane of the electroacoustic conversion film. In addition, in a case where a thin electrode such as a vaporized film is exposed to the outside for connection with the wiring and stored in this state, the electrode is oxidized depending on the storage environment and the conductivity is lowered.

On the other hand, it is suggested that a hole is provided in the protective layer, a conductive material is inserted into the hole, and a lead-out wire is connected to the conductive material.

For example, JP2016-015354A discloses a configuration in which a recess portion is provided in the protective layer, a conductive material is inserted into the recess portion, and a lead-out wire for electrically connecting the electrode layer and an external device is connected to the conductive material. With this, it is disclosed that the electrical connection between the electrode layer and the lead-out wire is ensured, and the electrode layer is completely covered with the protective layer, and thus it is possible to prevent the electrode layer from being deteriorated due to oxidation or the like.

SUMMARY OF THE INVENTION

However, according to the study by the present inventors, in a case where a coating liquid of a liquid conductive material is applied to the hole provided in the protective layer, the coating thickness varies depending on the viscosity of the coating liquid, and it is difficult to secure the conductivity in some cases. In addition, since the protective layer is as thin as about 4 μm, for example, a depth of the hole provided with the hole in the protective layer is about 4 μm, and considering the warp of the electroacoustic conversion film, it becomes difficult to reliably apply the coating liquid on the hole. Therefore, there is a concern that the electrical connection to the electrode layer cannot be ensured.

In addition, since silver paste used as a conductive material is expensive, there is a desire to reduce a use amount, and thus it becomes difficult to increase the use amount of the conductive material and to ensure that the conductive material is present in the hole.

An object of the present invention is to solve a problem of such a related art, and to provide a piezoelectric element capable of reliably connecting to an electrode layer.

In order to achieve the above-described object, the present invention has the following configuration.

[1] A piezoelectric element having a piezoelectric layer, electrode layers formed on both sides of the piezoelectric layer, and a protective layer laminated on a surface of the electrode layer opposite to a surface on a piezoelectric layer side, in which the protective layer has a hole that penetrates from a surface to the electrode layer, and the piezoelectric element further includes a filling member consisting of a conductive material, which is formed from an inside of the hole to a part of the surface of the protective layer and is electrically connected to the electrode layer, a conductive member which covers at least a part of the filling member and is electrically connected to the filling member, and a fixing member for fixing the conductive member.

[2] The piezoelectric element as described in [1], in which the conductive member is a conductive sheet.

[3] The piezoelectric element as described in [1], in which the conductive member has a conductor connected to the filling member and a conductive wire or a conductive sheet connected to the conductor.

[4] The piezoelectric element as described in any one of [1] to [3], in which the fixing member fixes the conductive member to the protective layer.

[5] The piezoelectric element as described in any one of [1] to [4], in which the protective layer has a convex portion formed on an edge portion of the hole.

[6] The piezoelectric element as described in any one of [1] to [5], in which a circle equivalent diameter of the hole is gradually changed in a depth direction, and a circle equivalent diameter on an electrode layer side is smaller than a circle equivalent diameter on a conductive member side.

[7] The piezoelectric element as described in any one of [1] to [6], in which a carbon amount on a surface of the electrode layer present in the hole is smaller in a central portion in a surface direction than that in a region other than a central portion.

[8] The piezoelectric element as described in any one of [1] to [7], in which a carbon amount on a surface of the electrode layer in the hole is larger in a central portion in a surface direction than that in the region other than the central portion.

[9] The piezoelectric element as described in any one of [1] to [8], in which an opening shape of the hole is a circular shape.

[10] The piezoelectric element as described in any one of [1] to [9], in which the protective layer has a plurality of the holes, and a plurality of the filling members which are formed in each of the plurality of holes.

[11] The piezoelectric element as described in [10], in which the plurality of filling members are connected on the surface of the protective layer.

[12] The piezoelectric element as described in any one of [1] to [11], further including an enclosing member that surrounds a periphery of the hole on the surface of the protective layer, in which the filling member is formed at least in the enclosing member.

[13] The piezoelectric element as described in any one of [1] to [12], in which the protective layer has a recess portion formed in a periphery of the hole.

[14] The piezoelectric element as described in any one of [1] to [13], in which a thickness of the protective layer is 3 µm to 100 µm.

[15] The piezoelectric element as described in any one of [1] to [14], in which a thickness of the electrode layer is 0.05 µm to 10 µm.

[16] The piezoelectric element as described in any one of [1] to [15], further including a gap portion between the electrode layer and the piezoelectric layer at a position of the hole, in which a difference between an average height of an interface of the piezoelectric layer, with the electrode layer at a position where the hole is not formed, and an average height of an interface of the piezoelectric layer, with the electrode layer at a position of the hole, is 25 µm or less.

[17] The piezoelectric element as described in any one of [1] to [16], in which the conductive member has a long shape, the conductive member has a folded-back portion that is folded back in a longitudinal direction, and the fixing member fixes the conductive member and the protective layer in a region opposite to a connection position between the conductive member and the filling member, across the folded-back portion.

[18] The piezoelectric element as described in any one of [1] to [17], in which the conductive member has a long shape, the conductive member is connected to the filling member on one end portion side in the longitudinal direction, and the fixing member is arranged at a position farther from the one end portion than the connection position between the conductive member and the filling member in the longitudinal direction of the conductive member.

[19] The piezoelectric element as described in [18], further including a second fixing member for fixing at least a part of an edge portion of a region between the one end portion of the conductive member and the fixing member, to the protective layer.

[20] The piezoelectric element as described in any one of [1] to [19], in which the piezoelectric layer consists of a polymer composite piezoelectric body containing piezoelectric particles in a matrix containing a polymer material.

According to the present invention, there is provided a piezoelectric element capable of ensuring an electrical connection to an electrode layer.

DESCRIPTION OF THE PREFERRED EMBODIMENTS

Hereinafter, a piezoelectric element of an embodiment of the present invention will be described in detail based on suitable examples shown in the accompanying drawings.

Descriptions of the constituent requirements described below may be made based on representative embodiments of the present invention, but the present invention is not limited to such embodiments.

In the present specification, a numerical range expressed using "to" means a range including numerical values described before and after "to" as a lower limit and an upper limit.

[Piezoelectric Element]

A piezoelectric element of the embodiment of the present invention is a piezoelectric element including a piezoelectric layer, electrode layers formed on both sides of the piezoelectric layer, and a protective layer laminated on a surface of the electrode layer opposite to a surface on the piezoelectric layer side, in which the protective layer has a hole that penetrates from a surface to the electrode layer, and the piezoelectric element further includes a filling member consisting of a conductive material, which is formed from an inside of the hole to a part of the surface of the protective layer and is electrically connected to the electrode layer, a conductive member which covers at least a part of the filling member and is electrically connected to the filling member, and a fixing member for fixing the conductive member.

In addition, in the piezoelectric element of the embodiment of the present invention, the conductive member may be a conductive sheet such as a copper foil. Alternatively, the conductive member may be a combination of a plurality of conductive members. For example, a configuration having a conductor and a conductive wire or a conductive sheet connected to the conductor is exemplified.

Figure 22:
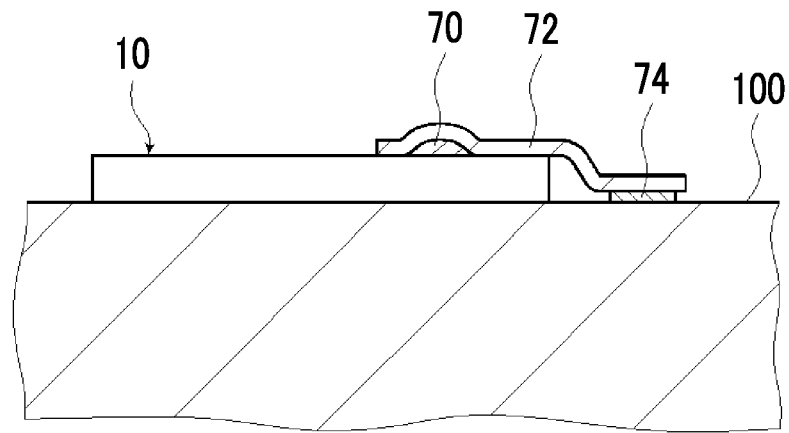
FIG. 22 is a schematic diagram of an example of an article including the piezoelectric element of the present invention.

In the piezoelectric element of the embodiment of the present invention, the fixing member fixes the conductive member to a predetermined site. The fixing member may be one that fixes the conductive member to the protective layer, or may be one that fixes the conductive member to another site of the piezoelectric element. Alternatively, the fixing member may fix the conductive member to another member. For example, as illustrated in FIG. 22, in a case where a piezoelectric element 10 is fixed to a vibration plate 100, a fixing member 74 may fix a conductive member 72 to the vibration plate 100.

Figure 1:
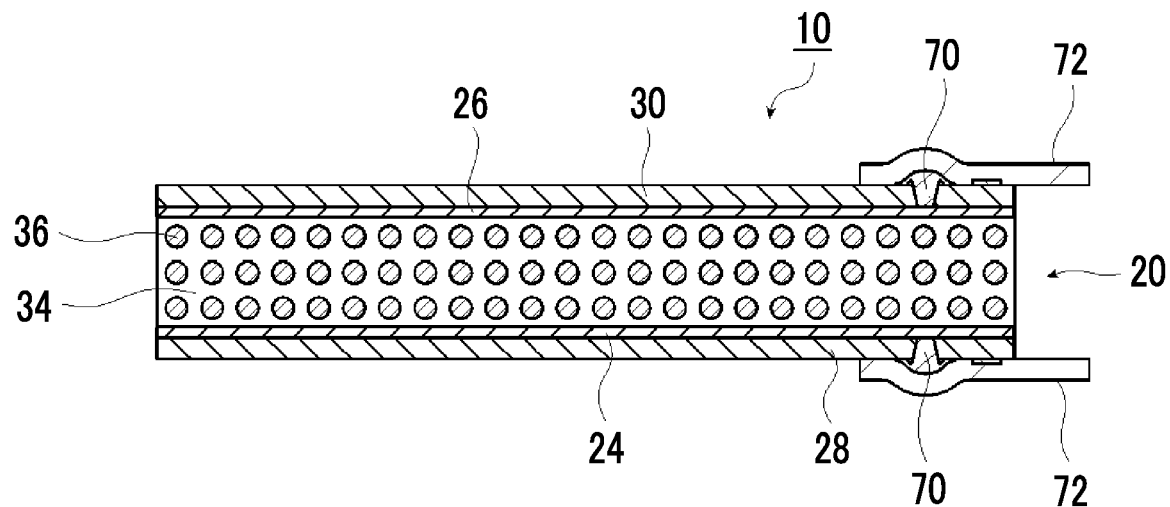
FIG. 1 is a cross-sectional view schematically illustrating an example of a piezoelectric element of the present invention.
Figure 2:
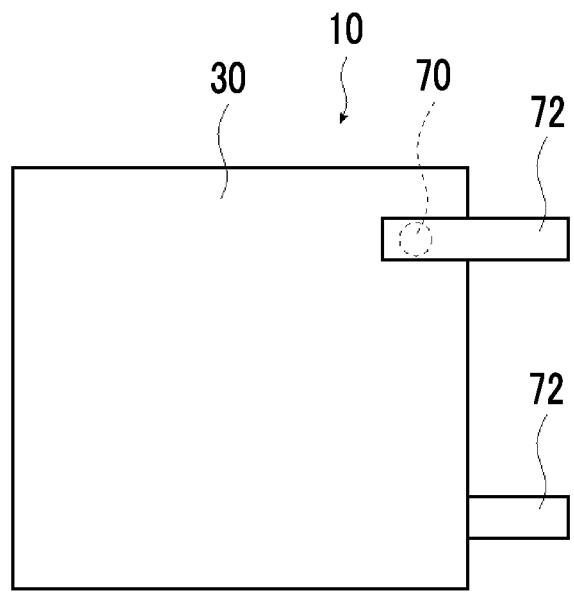
FIG. 2 is a plan view of the piezoelectric element of FIG. 1.
Figure 3:
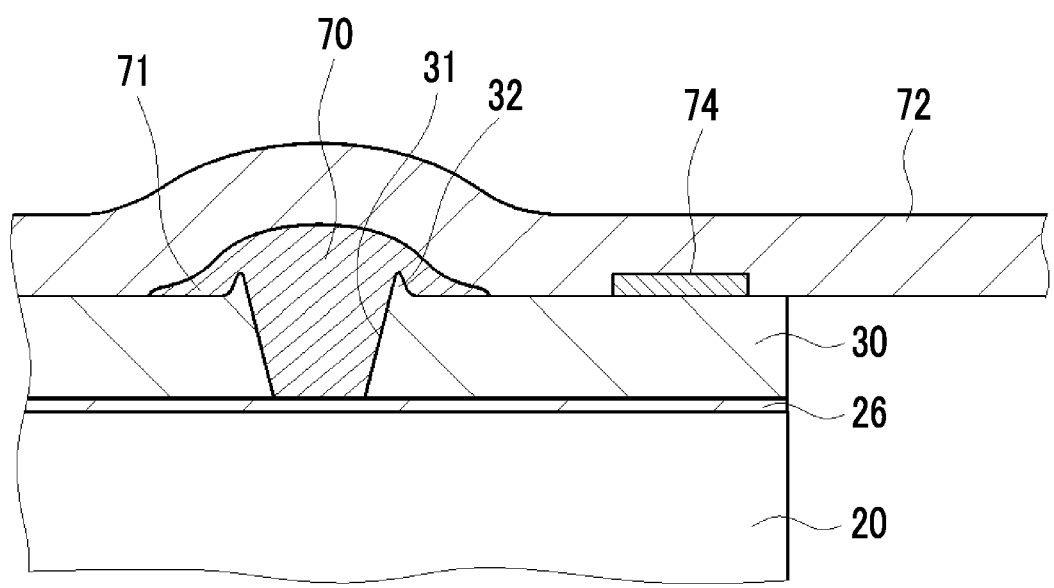
FIG. 3 is a cross-sectional view illustrating an enlarged portion of a piezoelectric layer of FIG. 1.

FIG. 1 conceptually illustrates an example of the piezoelectric element of the embodiment of the present invention in a cross-sectional view. FIG. 2 illustrates a plan view of the piezoelectric element of FIG. 1 as viewed from above. FIG. 3 illustrates an enlarged sectional view of a part of the piezoelectric element of FIG. 1.

The piezoelectric element 10 as illustrated in FIGS. 1 to 3 includes a piezoelectric layer 20 which is a sheet-like material having piezoelectric properties, a lower electrode 24 laminated on one surface of the piezoelectric layer 20, a lower protective layer 28 laminated on the lower electrode 24, an upper electrode 26 laminated on the other surface of the piezoelectric layer 20, an upper protective layer 30 laminated on the upper electrode 26, a filling member 70, a conductive member 72, and a fixing member 74.

The piezoelectric layer 20 illustrated in FIG. 1 contains piezoelectric particles 36 in a matrix 34 containing a polymer material. In addition, the lower electrode 24 and the upper electrode 26 are electrode layers in the present invention. In addition, a lower protective layer 28 and an upper protective layer 30 are protective layers in the present invention.

As will be described later, the piezoelectric element 10 (piezoelectric layer 20) is polarized in a thickness direction as a preferable aspect.

Here, the piezoelectric element of the embodiment of the present invention has a hole in the protective layer, a filling member formed in the hole, a conductive member connected to the filling member, and a fixing member for fixing the conductive member. This point will be described with reference to FIG. 3. Although FIG. 3 is an enlarged view of a part of the upper protective layer 30 side, the lower protective layer 28 side also has the same configuration. In the following description, the upper protective layer 30 and the upper electrode 26 side will be described as an example.

As illustrated in FIG. 3, the upper protective layer 30 has a hole 31 penetrating from the surface to the upper electrode 26. That is, the hole 31 is formed so as to penetrate the upper protective layer 30 from a surface opposite to the upper electrode 26 to an interface on the upper electrode 26 side. As illustrated in FIGS. 1 and 2, the hole 31 is formed in the vicinity of an end portion of the upper protective layer 30 in a surface direction.

In addition, in an example shown in FIG. 3, as a preferable aspect, a convex portion 32 is formed on an edge portion of the hole 31. The convex portion 32 is formed in a substantially annular shape on the edge portion of the hole 31 so as to surround the hole 31.

The filling member 70 consists of a conductive material, is filled in the hole 31, and is formed so as to cover a part of the surface of the upper protective layer 30. Hereinafter, a part of the filling member 70 that protrudes from the hole 31 is also referred to as a protruding portion 71. The filling member 70 is in contact with the upper electrode 26 in the hole 31 and is electrically connected to the upper electrode 26.

In addition, in the example illustrated in FIG. 3, the upper protective layer 30 has the convex portion 32, but the protruding portion 71 of the filling member 70 is formed from the hole 31 to the outside of the convex portion 32.

The conductive member 72 is arranged so as to cover at least a part of the filling member 70, and is electrically connected to the filling member 70. In the illustrated example, the conductive member 72 is arranged so as to cover the entire surface of the filling member 70, viewed from a direction perpendicular to the surface of the upper protective layer 30.

As illustrated in FIGS. 1 and 2, the conductive member 72 is a long conductive sheet, and is connected to the filling member 70 on one end portion side in the longitudinal direction. In addition, the conductive member 72 is arranged so that the other end portion in the longitudinal direction is present outside the upper protective layer 30 in a surface direction.

The fixing member 74 fixes the conductive member 72 and the upper protective layer 30 at a position of the conductive member 72 that does not cover the filling member 70. In the example illustrated in FIG. 3, the fixing member 74 is arranged at a position farther from the end portion on the filling member 70 side than a connection position between the conductive member 72 and the filling member 70 in a longitudinal direction of the conductive member 72. In addition, the fixing member 74 is arranged between the connection position between the conductive member 72 and the filling member 70 and an end edge of the upper protective layer 30 in the longitudinal direction of the conductive member 72. In addition, in the illustrated example, the fixing member 74 is arranged between the upper protective layer 30 and the conductive member 72, and adheres the upper protective layer 30 and the conductive member 72 to each other.

In such a piezoelectric element 10, the conductive member 72 is electrically connected to the filling member 70, and the filling member 70 is electrically connected to the upper electrode 26. Therefore, the conductive member 72 can be used as a lead-out wire, and the wire can be connected to the conductive member 72.

Here, as described above, in a case where a coating liquid of a liquid conductive material is applied to the hole provided in the protective layer, a coating thickness varies depending on the viscosity of the coating liquid, and it becomes difficult to secure the conductivity in some cases. In addition, since the protective layer is as thin as about 4 µm, for example, a depth of the hole provided with the hole in the protective layer is about 4 µm, and considering the warp of the electroacoustic conversion film, it becomes difficult to reliably apply the coating liquid on the hole. In addition, since silver paste used as a conductive material is expensive, there is a desire to reduce a use amount, and thus it becomes difficult to increase the use amount of the conductive material and to ensure that the conductive material is present in the hole.

On the other hand, the piezoelectric element of the embodiment of the present invention has a hole in the protective layer, the filling member formed in the hole, the conductive member covering the filling member, and the fixing member for fixing the conductive member and the protective layer. In the piezoelectric element having such a configuration, the filling member is formed by applying a coating liquid of a conductive material to the hole provided in the protective layer, covering the conductive member on the coating liquid, and then drying and curing the coating liquid. In a case where the conductive member is placed on the coating liquid, the conductive member and the protective layer are fixed by the fixing member, and thus it is possible to prevent a position of the conductive member from being deviated in a state of the coating liquid being uncured. In addition, by covering the coating liquid with the conductive member, it is possible to prevent the coating liquid from moving from above the hole, and it is possible to make the filling member reliably present in the hole. Therefore, the piezoelectric element of the embodiment of the present invention can reliably make an electrical connection between the conductive member 72 and the filling member 70, and an electrical connection between the filling member 70 and the upper electrode 26.

In addition, since the filling member can be reliably present in the hole, it is not necessary to increase a use amount of the conductive material.

Here, a shape of an opening surface of the hole 31 is not limited, but can be various shapes such as a circular shape, an elliptical shape, a rectangular shape, a polygonal shape, and an indefinite shape. The circular shape is preferable from a viewpoint of easiness of formation and the like.

In addition, a size of the opening surface of the hole 31 is not particularly limited as long as an electrical connection with the filling member 70 can be secured and the piezoelectric element can operate properly. A circle equivalent diameter of the opening surface of the hole 31 is preferably 0.5 mm to 20 mm, more preferably 1.5 mm to 5 mm, and even more preferably 2 mm to 3 mm.

In addition, a height of a portion of the filling member 70 protruding from the hole 31 (height from the surface of the upper protective layer 30, hereinafter, also referred to as "height of filling member") is not particularly limited as long as electrically the electrical connection between the conductive member 72 can be secured. The height of the filling member is preferably 2 µm to 200 µm, more preferably 10 µm to 100 µm, and even more preferably 20 µm to 50 µm.

In addition, a size (size in the surface direction) of a protruding portion 71 of the filling member 70 is not particularly limited as long as the electrical connection with the conductive member 72 can be secured. A circle equivalent diameter of the protruding portion 71 is preferably 1 mm to 40 mm, more preferably 2 mm to 30 mm, and even more preferably 2 mm to 20 mm.

Here, in the example illustrated in FIG. 3, the upper protective layer 30 has a configuration in which the convex portion 32 is provided at an edge portion of the hole 31 but is not limited to the configuration, and may have a configuration in which the convex portion 32 is not provided. In addition, by having the configuration in which the convex portion 32 is provided, a depth of the hole 31 can be made deeper than a thickness of the upper protective layer 30, the coating liquid of the conductive material can be easily collected, and a contact area between the filling member 70 and the upper electrode 26 and a contact area between the filling member 70 and the conductive member 72 can be secured.

A height of the convex portion 32 is preferably 0.2 µm to 100 µm, more preferably 0.5 µm to 50 µm, and even more preferably 0.7 µm to 10 µm.

Here, in the example shown in FIG. 3, the configuration has one hole 31 and one filling member 70, but the present invention is not limited to this, and a plurality of the holes 31 and the filling members 70 may be provided.

Figure 4:
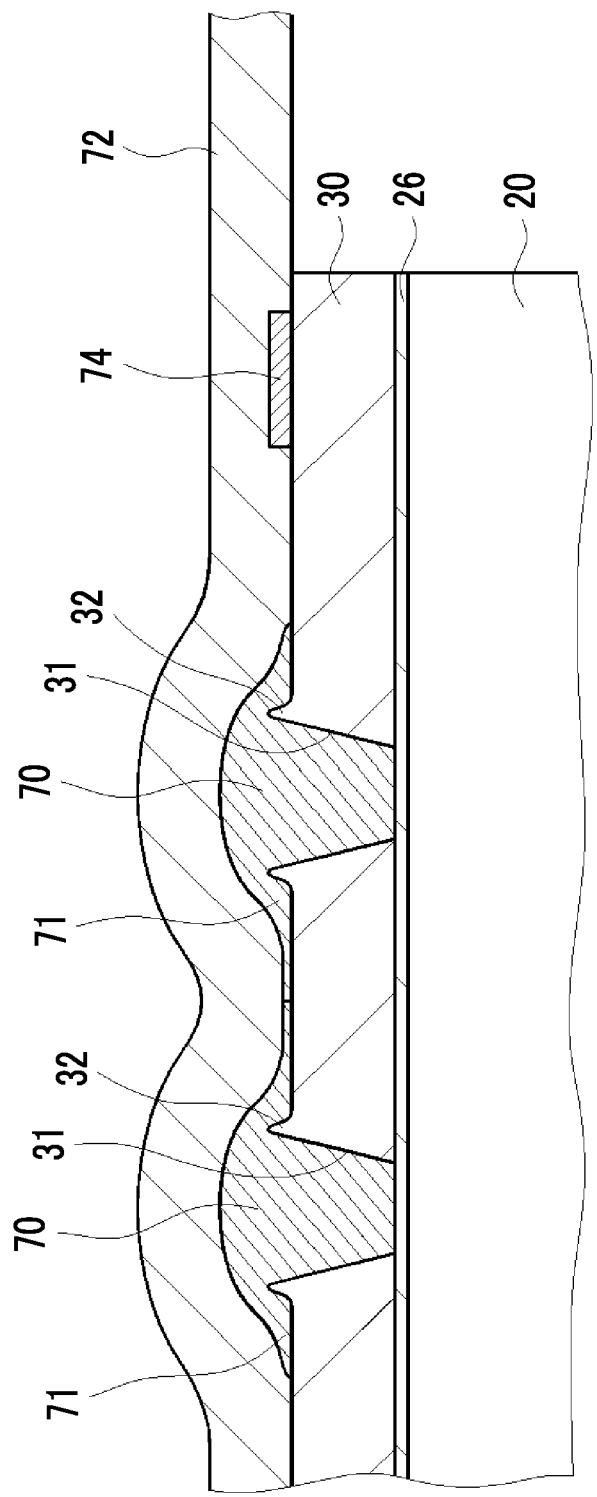
FIG. 4 is a partially enlarged sectional view of another example of the piezoelectric element of the present invention.

For example, in the example illustrated in FIG. 4, the configuration has two holes 31 and two filling members 70 arranged in each of the two holes 31. The two holes 31 are arranged adjacent to each other in the longitudinal direction of the conductive member 72. Each of the two filling members 70 is filled in the hole 31 in the same manner as the above-mentioned filling member, and is formed so as to cover a part of the surface of the upper protective layer 30. The conductive member 72 is arranged so as to cover the two filling members 70 arranged in the two holes 31. In addition, the two filling members 70 are connected to the protruding portion 71 on the surface of the upper protective layer 30.

Figure 5:
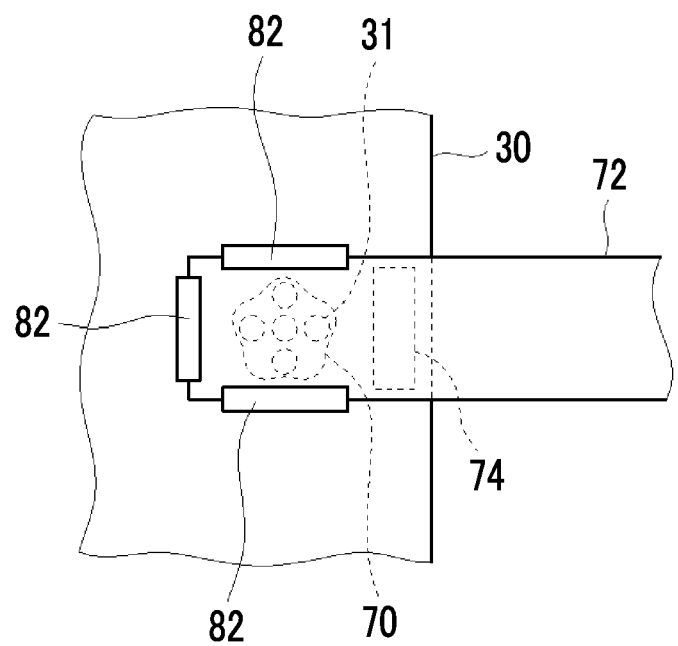
FIG. 5 is a partially enlarged sectional view of another example of the piezoelectric element of the present invention.

In addition, in the example illustrated in FIG. 5, five holes 31 arranged on a cross and a filling member 70 arranged in each of the five holes 31 are provided. The filling member 70 has the protruding portion 71 connected and integrated on the surface of the upper protective layer 30. In addition, the protruding portion 71 of the filling member 70 is formed so as to completely cover an inner side region enclosed by the five holes 31 of the surface of the upper protective layer 30.

In a case of a configuration in which the piezoelectric element has a plurality of filling members 70, at least one filling member 70 may have a protruding portion 71, but it is preferable that all the filling members 70 have a protruding portion 71.

In addition, the piezoelectric element of the embodiment of the present invention may have a configuration in which an enclosing member surrounding the periphery of the hole is provided on the surface of the protective layer, and the filling member is formed in the enclosing member.

Figure 6:
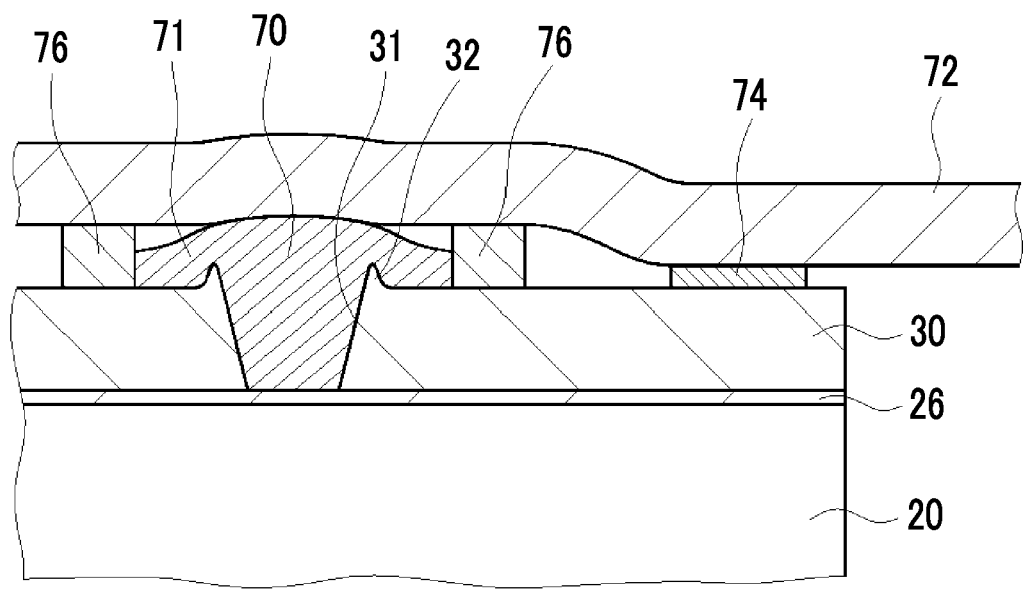
FIG. 6 is a partially enlarged sectional view of another example of the piezoelectric element of the present invention.

For example, in the example illustrated in FIG. 6, there is provided an enclosing member 76 surrounding a periphery of the hole 31 on an outer peripheral side of the hole 31 and the convex portion 32, of the surface of the upper protective layer 30. In a region enclosed by the enclosing member 76, the protruding portion 71 of the filling member 70 is present. In addition, an upper surface (surface opposite to the upper protective layer 30 side) of the enclosing member 76 is covered with the conductive member 72.

The enclosing member 76 is, for example, an annular member, and a height (thickness) is higher than that of the convex portion 32. In addition, for a configuration that the filling member 70 formed on the inner side of the enclosing member 76 and the conductive member 72 are in contact with each other, a height of the enclosing member 76 is preferably equal to or less than the height of the filling member 70.

By having the enclosing member 76, it is possible to prevent the coating liquid from moving from the hole 31 in a case of applying the coating liquid of the conductive material, and it is possible to make the filling member 70 reliably present at the position of the hole 31.

A shape of the opening portion of the enclosing member 76 is not limited to a circular shape, and can be can various shapes such as an elliptical shape, a rectangular shape, a polygonal shape, and an indefinite shape.

In addition, in a case where the upper protective layer 30 has a plurality of holes 31, the upper protective layer 30 may have a configuration of including a plurality of enclosing members 76 arranged at the position of each hole 31, or may have a configuration of including one enclosing member 76 having a size that surrounds the plurality of holes 31.

The size (diameter) and the height of the enclosing member 76 may be appropriately set according to the size of the hole 31, the height of the convex portion 32, the size and the height of the protruding portion 71 of the filling member 70, and the like.

A circle equivalent diameter of the enclosing member 76 is preferably 3 mm to 60 mm, more preferably 5 mm to 50 mm, and even more preferably 5 mm to 40 mm.

The height of the enclosing member 76 is preferably 0.01 mm to 1 mm, more preferably 0.1 mm to 0.5 mm, and even more preferably 0.1 mm to 0.3 mm.

The enclosing member 76 is preferably adhered to the upper protective layer 30 with an adhesive or the like. In addition, the enclosing member 76 is also preferably adhered to the conductive member 72 with an adhesive or the like.

In addition, the piezoelectric element of the embodiment of the present invention may have a recess portion formed in a periphery of the hole of the protective layer.

Figure 7:
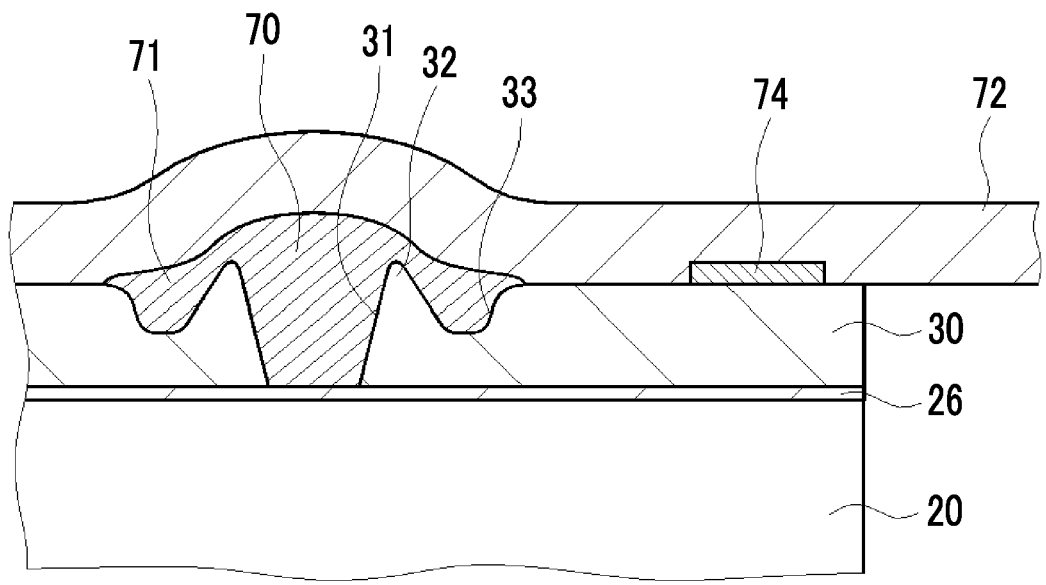
FIG. 7 is a partially enlarged sectional view of another example of the piezoelectric element of the present invention.

For example, in the example illustrated in FIG. 7, there is provided a recess portion 33 in a periphery of the hole 31 on an outer peripheral side of the hole 31 and the convex portion 32, of the surface of the upper protective layer 30. A protruding portion 71 of the filling member 70 is present in the recess portion 33. By having the recess portion 33, it is possible to retain the coating liquid at a position of the hole 31 in a case where the coating liquid of the conductive material is applied, and it is possible to make the filling member 70 reliably present at the position of the hole 31.

In a case where the upper protective layer 30 has the convex portion 32, the recess portion 33 is formed at an outer peripheral side of the convex portion 32. In addition, in a case of having the enclosing member 76, the recess portion 33 is formed on an inner side of the enclosing member 76.

A depth of the recess portion 33 from a surface of the upper protective layer 30 is preferably 0.1 µm to 3 µm, more preferably 0.5 µm to 2 µm, and even more preferably 1 µm to 2 µm.

Here, it is preferable that the circle equivalent diameter of the hole changes stepwise in the depth direction, and the circle equivalent diameter on the electrode layer side is smaller than the circle equivalent diameter on the conductive member side.

Figure 8:
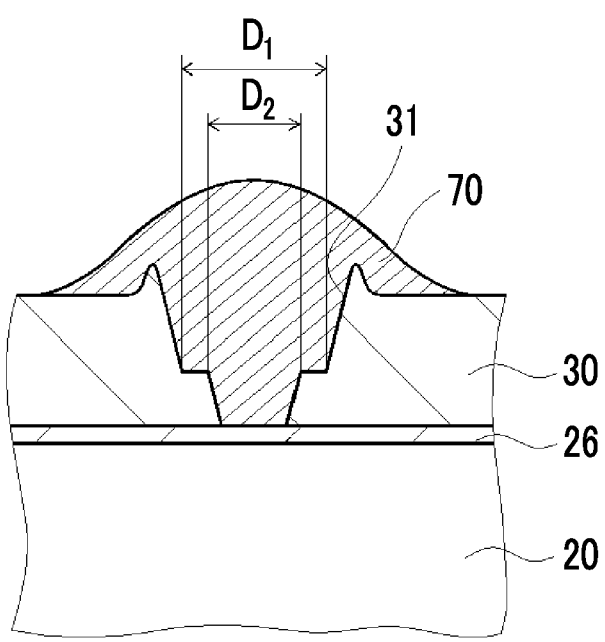
FIG. 8 is a partially enlarged sectional view of another example of the piezoelectric element of the present invention.

For example, in the example illustrated in FIG. 8, the size of the hole 31 changes in the middle of the depth direction, and a circle equivalent diameter $D_2$ in a region on the upper electrode 26 side is smaller than a circle equivalent diameter $D_1$ in a region on the surface side (conductive member side). In FIG. 8, the conductive member is not illustrated.

As will be described in detail later, the holes formed in the protective layer are formed by laser processing. Since heat is generated during laser processing and the protective layer, the piezoelectric layer, and the like in the vicinity of the hole have heat, the electrode layer at the position of the hole is heated and the strength tends to decrease. In particular, the electrode layer is easily damaged at a boundary position between the hole and the protective layer.

On the other hand, by reducing a size of the holes in the region on the electrode layer side, it is possible to suppress heating of the electrode layer and prevent the strength of the electrode layer from being lowered. In addition, by increasing the size of the holes in the region on the surface side, it is possible to appropriately retain the coating liquid in the holes during applying the coating liquid of the conductive material.

In addition, in a case where a hole is formed in the protective layer by laser processing, the electrode layer and the piezoelectric layer expand due to heat, but the coefficient of thermal expansion and the thermal conductivity differ between the electrode layer and the piezoelectric layer, and thus there is a case where a gap portion is formed between the electrode layer and the piezoelectric layer in the hole due to expansion by heating and extraction by slow heating. In particular, since heat tends to be trapped in a central portion of the hole, the gap portion tends to be formed in the central portion.

Figure 9:
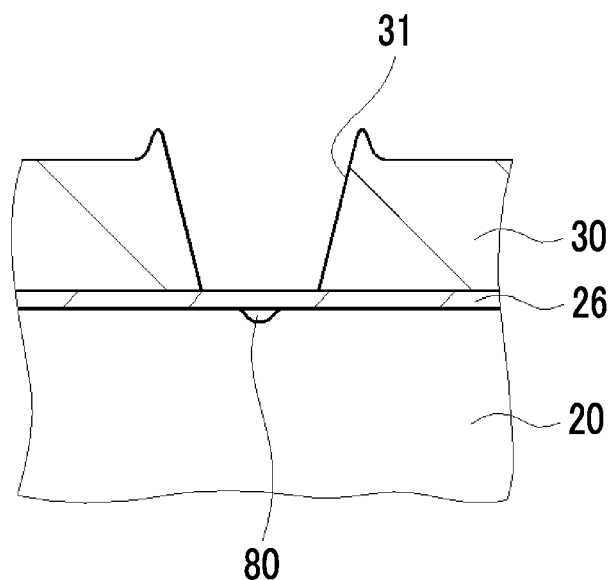
FIG. 9 is a partially enlarged sectional view of another example of the piezoelectric element of the present invention.

For example, as illustrated in FIG. 9, the piezoelectric layer 20 is deformed to form a gap portion 80.

In FIG. 9, a filling member 70 and a conductive member 72 are not illustrated.

In a case where such a gap portion 80 is provided, the relative permittivity between the electrode layers changes, and thus there is a concern that performance as a piezoelectric element deteriorates.

On the other hand, a difference d between an average height of the interface of the piezoelectric layer with the electrode layer at the position where the hole is not formed and an average height of the interface of the piezoelectric layer with the electrode layer at the position of the hole is preferably 25 µm or less, more preferably 0 µm to 20 µm, and even more preferably 0 µm to 15 µm. In addition, the difference d is preferably 50% or less, more preferably 0% to 40%, and even more preferably 0% to 30% of an average thickness of the piezoelectric layer.

Figure 10:
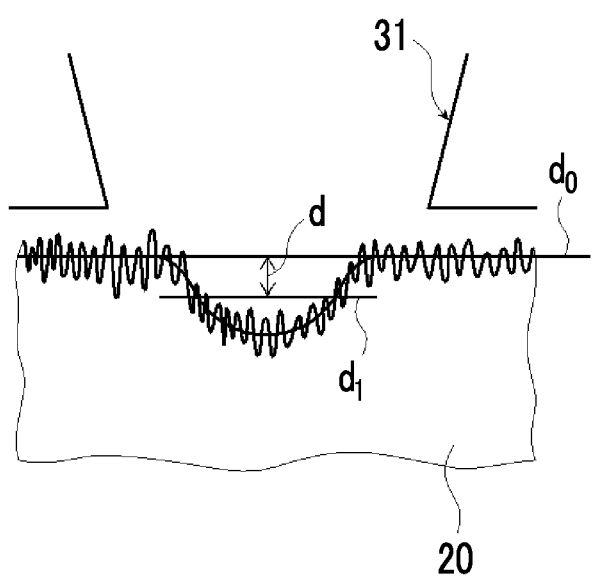
FIG. 10 is a conceptual diagram for describing an average height of an interface.

A method of measuring the difference d will be described with reference to FIG. 10.

The piezoelectric layer including the position of the hole is cut out to an optional size, embedded in an epoxy resin or the like, and cured. Subsequently, the piezoelectric layer in the resin is cut with a focused ion beam (FIB) or the like to expose a cross section of the piezoelectric layer. This cross section is observed with an optical microscope or the like, and a boundary line (interface) between the piezoelectric layer and the electrode layer having a length of about 40 mm is converted into a curve mathematical formula by image conversion software. The interface between the piezoelectric layer and the electrode layer has roughness as illustrated in FIG. 10.

In this cross section, an arithmetic mean roughness Ra and the like are calculated by image analysis of the boundary line in a portion other than the hole on about 10 cut surfaces, and an average value is calculated to calculate an average height $d_0$ of the piezoelectric layer in the portion other than the hole.

Similarly, an average height $d_1$ of the interface of the piezoelectric layer is calculated from the image analysis of the boundary line in the hole.

The difference between the calculated average height $d_0$ and the average height $d_1$ is calculated to obtain the difference d of the average height.

Specifically, an average height is obtained in the portion other than a perforation at an average height (Rc) of a roughness curve element described in JIS B 0601-2001. At this time, in the cross-sectional curve, the average height $d_0$ of the left and right interfaces with respect to the hole is calculated. Similarly, an average height $d_1$ of the interface of the piezoelectric layer is calculated from the image analysis of the boundary line in the hole. Of the left and right, the one with the larger deviation between $d_1$ and $d_0$ is defined as d.

In addition, in a case where a hole is formed in the protective layer by laser processing, there is a case where the protective layer is not completely removed and a residue of the protective layer is present on the surface of the electrode layer. The residue of the protective layer is unevenly distributed on the surface of the electrode layer depending on conditions of laser processing and the like.

For example, in the central portion of the hole, heat during laser processing tends to be trapped, and thus the residue of the protective layer tends to be less than that in a peripheral portion. On the other hand, depending on the conditions of laser processing, it is possible to form a configuration in which the residue of the protective layer is large in the central portion of the hole, and is small in the peripheral portion.

In the configuration in which the residue of the protective layer in the central portion of the hole is smaller than that in the peripheral portion, the electrical connection between the filling member and the electrode layer can be secured in the central portion, and the decrease in the strength of the electrode layer can be suppressed in the peripheral portion.

On the other hand, in a configuration in which the residue of the protective layer in the central portion of the hole is larger than that in the peripheral portion, since heat can be suppressed from being trapped in the central portion during laser processing, the generation of the above-mentioned gap portion can be suppressed and change in the relative permittivity can be suppressed.

Since the protective layer consists of a resin film such as polyethylene terephthalate (PET), the residue of the protective layer contains carbon. Therefore, in a case where an amount of the residue of the protective layer is measured on the surface of the electrode layer, an amount of carbon may be measured on the surface of the electrode layer.

The amount of carbon on the surface of the electrode layer can be obtained by a method of peeling the conductive member from the piezoelectric element and performing elemental analysis by XPS (X-ray photoelectron spectroscope) while etching from the surface of the filling member to observe the presence or absence of carbon.

That is, the configuration in which the residue of the protective layer in the central portion of the hole is smaller than that in the peripheral portion is a configuration in which the amount of carbon on the surface of the electrode layer in the hole is smaller in the central portion in a surface direction than in a region other than the central portion. In addition, the configuration in which the residue of the protective layer in the central portion of the hole is larger than that in the peripheral portion is a configuration in which the amount of carbon on the surface of the electrode layer in the hole is larger in the central portion in the surface direction than in the region other than the central portion.

The central portion of the hole is a region having an area of 1/16 of the area of the hole centered on a center position of the hole in the surface direction. In addition, the peripheral portion is a region other than the central portion. The amount of the residue of the protective layer is an average value measured at 10 points in this range.

Here, the piezoelectric element of the embodiment of the present invention may have a configuration in which the conductive member has a long shape, the conductive member has a folded-back portion that is folded back in a longitudinal direction, the fixing member fixes the conductive member and the protective layer in a region opposite to the connection position between the conductive member and the filling member, with the folded-back portion interposed therebetween.

This configuration will be described with reference to FIG. 11.

Figure 11:
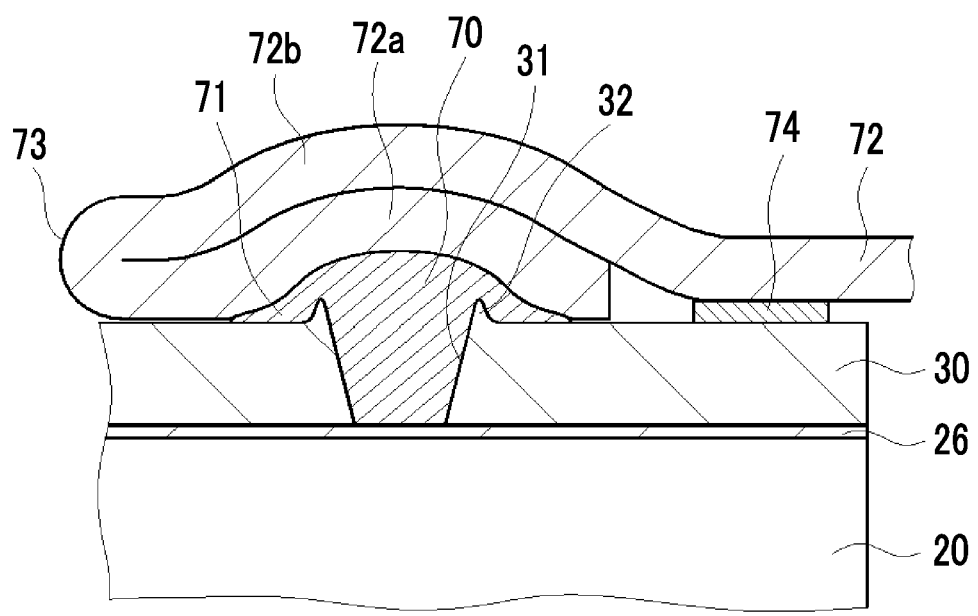
FIG. 11 is a partially enlarged sectional view of another example of the piezoelectric element of the present invention.

FIG. 11 is an enlarged cross-sectional view showing a part of another example of the piezoelectric element of the embodiment of the present invention.

Except for the shape of the conductive member 72, FIG. 11 has the same configuration as that of the piezoelectric element illustrated in FIG. 3, and thus the differences will be mainly made in the following description.

In FIG. 11, the conductive member 72 is folded back in the longitudinal direction, and in a case where one region is a region 72a and the other region is a region 72b with the folded-back portion 73 interposed therebetween, one surface of the region 72a is connected to the filling member 70, and one surface of the region 72b is connected to the fixing member 74.

That is, the region 72b in which the conductive member 72 is fixed to the upper protective layer 30 by the fixing member 74 is a region opposite to the region 72a connected to the filling member 70, with the folded-back portion 73 interposed therebetween.

As illustrated in FIG. 11, the conductive member 72 has the region 72a shorter than the region 72b, and the short region 72a is arranged on the filling member 70 toward the filling member 70. In addition, the region 72b of the conductive member 72 is fixed to the upper protective layer 30 by the fixing member 74 at a position at which the region 72b does not overlap with the region 72a.

In this way, by having a configuration in which the conductive member 72 is bent, one region 72*a* is connected to the filling member 70 with the folded-back portion 73 interposed therebetween, and the other region 72*b* is fixed to the upper protective layer 30 by the fixing member 74, in a case where the coating liquid of the conductive material is applied to the holes provided in the protective layer and the conductive member 72 is put on the coating liquid, since a force toward the coating liquid side is applied to the region 72*a*, it is possible to secure adhesion between the conductive member 72 and the coating liquid, and to obtain a reliable electrical connection between the conductive member 72 and the filling member 70.

In addition, even in a case where a force such as tensile force is applied to the region 72*b* of the conductive member 72, it is difficult for the force to be transmitted to the region 72*a*, and thus it is possible to obtain a reliable electrical connection between the conductive member 72 and the filling member 70.

Figure 12:
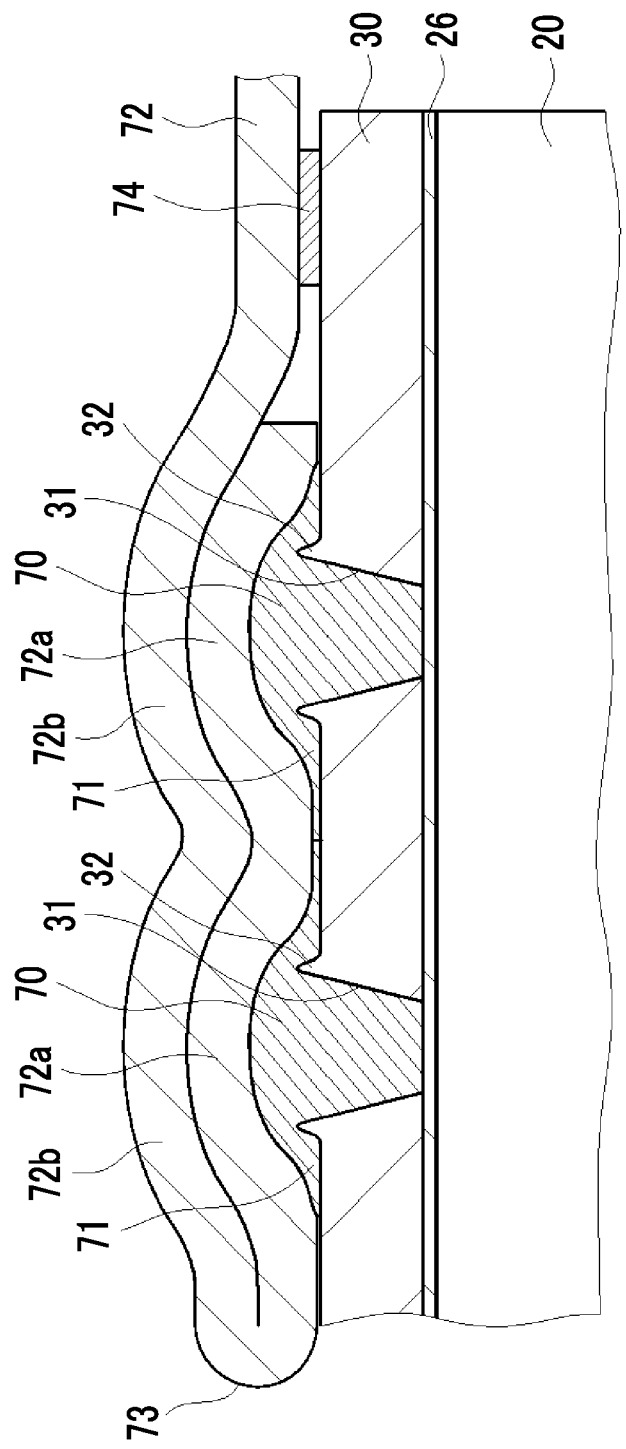
FIG. 12 is a partially enlarged plan view of another example of the piezoelectric element of the present invention.

In a case where a plurality of holes and filling members are provided, as illustrated in FIG. 12, a position of the folded-back portion 73 may be adjusted and arranged so that the region 72*a* of the conductive member 72 covers the plurality of filling members 70.

In addition, there may be provided a second fixing member for fixing an edge portion of the conductive member in the vicinity of the connection position with the filling member to the protective layer.

For example, in the example illustrated in FIG. 5, the conductive member 72 has a long shape. The conductive member 72 is connected to the filling member 70 on one end portion side in the longitudinal direction, and the fixing member 74 is arranged at a position farther from an end portion on the filling member 70 than the connection position between the conductive member 72 and the filling member 70 in the longitudinal direction of the conductive member 72. In addition, the conductive member 72 fixes three sides of the region between the end portion on the filling member 70 side and the fixing member 74 to the upper protective layer 30 by the second fixing member 82, respectively.

The second fixing member 82 is preferably provided at a position that does not overlap with the filling member 70 (protruding portion 71) in the surface direction.

Figure 13:
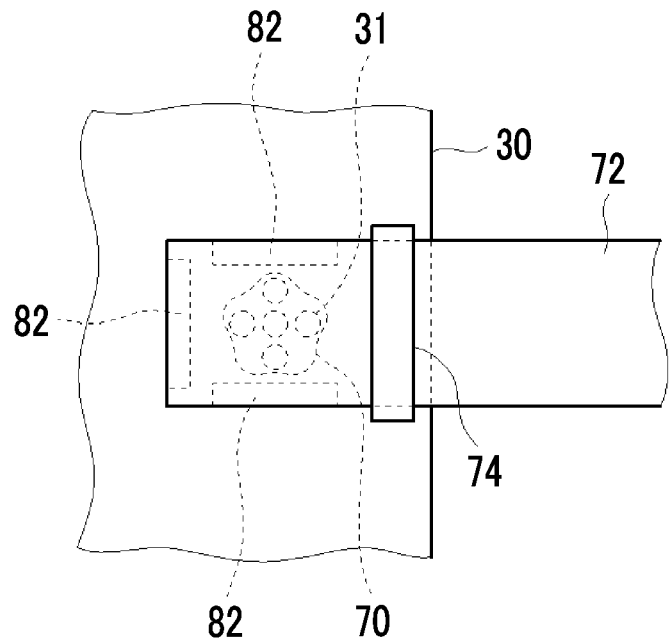
FIG. 13 is a partially enlarged plan view of another example of the piezoelectric element of the present invention.

As described above, by having the second fixing member for fixing the edge portion of the conductive member in the vicinity of the connection position with the filling member to the protective layer, it is possible to suppress the conductive member and the filling member from peeling off In addition, in FIGS. 3 and 5, the fixing member 74 is a so-called adhesive layer/bonding layer arranged between the conductive member 72 and the upper protective layer 30, but the present invention is not limited thereto. As illustrated in FIG. 13, it may be a so-called adhesive sheet fixed to the upper protective layer 30 from above the conductive member 72.

Similarly, in FIG. 5, the second fixing member 82 is a so-called adhesive sheet that is fixed to the upper protective layer 30 from above the conductive member 72, but the present invention is not limited thereto. As illustrated in FIG. 13, the second fixing member 82 may be a so-called adhesive layer/bonding layer arranged between the conductive member 72 and the upper protective layer 30.

In addition, in the piezoelectric element of the embodiment of the present invention, at the connection position between the filling member 70 and the conductive member 72, the filling member 70 has a recess portion, and the conductive member 72 may be formed to be curved along the recess portion.

Figure 20:
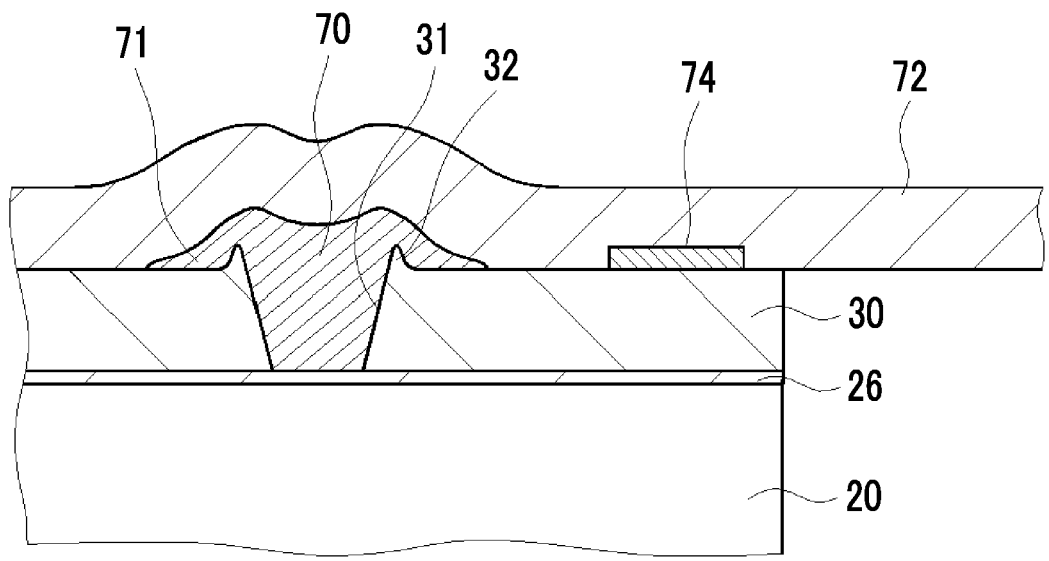
FIG. 20 is a partially enlarged sectional view of another example of the piezoelectric element of the present invention.

For example, in the example illustrated in FIG. 20, a recess portion is formed on the surface of the filling member 70 on the conductive member 72 side. In addition, the conductive member 72 is curved along the recess portion formed in the filling member 70 and is in contact with and connected to the filling member 70.

Figure 21:
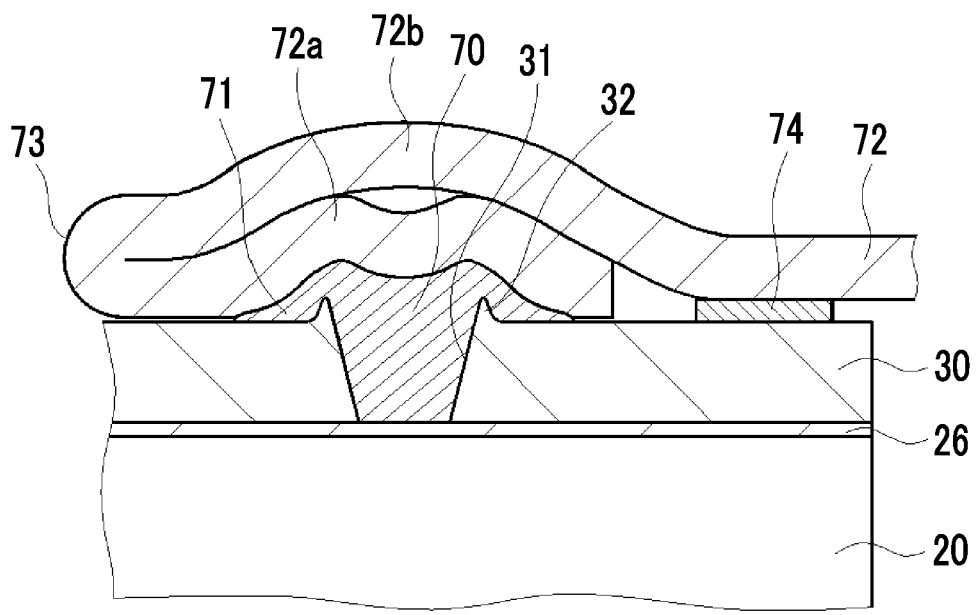
FIG. 21 is a partially enlarged sectional view of another example of the piezoelectric element of the present invention.

In addition, the example illustrated in FIG. 21 is an example of a configuration in which the conductive member 72 has a folded-back portion 73. In the example illustrated in FIG. 21, a recess portion is formed on the surface of the filling member 70 on the conductive member 72 side. In addition, the region 72*a* of the conductive member 72 is curved along the recess portion formed in the filling member 70 and is in contact with and connected to the filling member 70.

As described above, at the connection position between the filling member 70 and the conductive member 72, by having a configuration in which the filling member 70 has a recess portion and the conductive member 72 is curved along the recess portion, a contact area between the filling member 70 and the conductive member 72 can be increased, and the electrical connection between the filling member 70 and the conductive member 72 can be ensured.

In the examples illustrated in FIGS. 20 and 21, the recess portion formed in the filling member 70 is configured to be formed at a position corresponding to the hole 31 of the protective layer, but the present invention is not limited thereto. For example, in a case of the configuration in which a plurality of holes 31 are formed in the protective layer and the filling member 70 formed in each hole 31 is connected, a recess portion may be formed at a position at which the filling member 70 is connected.

In a manufacturing method of a piezoelectric element to be described later, the recess portion of the filling member 70 can be formed by applying the conductive material to be the filling member 70 to the hole 31, placing the conductive member 72 on a conductive material 84, and then pressing the conductive material 84 from above the conductive member 72.

Alternatively, the conductive member 72 is provided with a curved portion corresponding to the recess portion in advance, the conductive member 72 is placed so that the curved portion of the conductive member 72 is on the conductive material 84, and by transferring the recess portion to the conductive material 84, the recess portion of the filling member 70 can be formed.

Here, in the example illustrated in FIG. 3 and the like, an example in which the conductive member is a conductive sheet is described, but as described above, the conductive member may be a combination of a plurality of conductive members.

Figure 23:
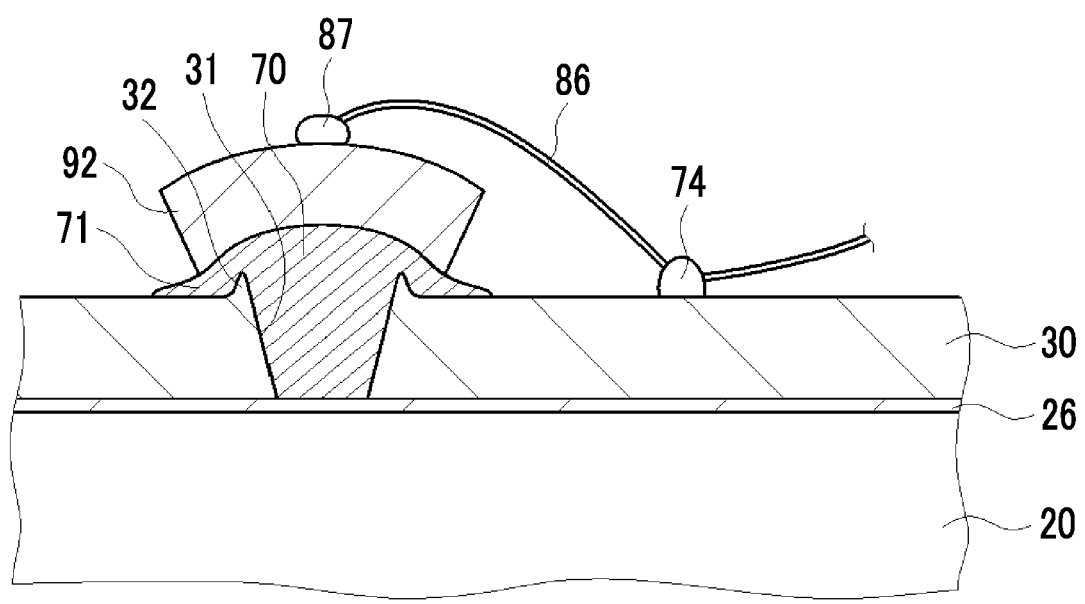
FIG. 23 is a partially enlarged sectional view of another example of the piezoelectric element of the present invention.

For example, the example illustrated in FIG. 23 is an example in which a conductor 92 and a conductive wire 86 are provided as the conductive member. The conductor 92 and the conductive wire 86 are connected by a solder 87. The conductor 92 is only connected on the filling member 70 and is not fixed to the upper protective layer 30 and the like. The conductive wire 86 is fixed to the upper protective layer 30 by the fixing member 74.

Figure 24:
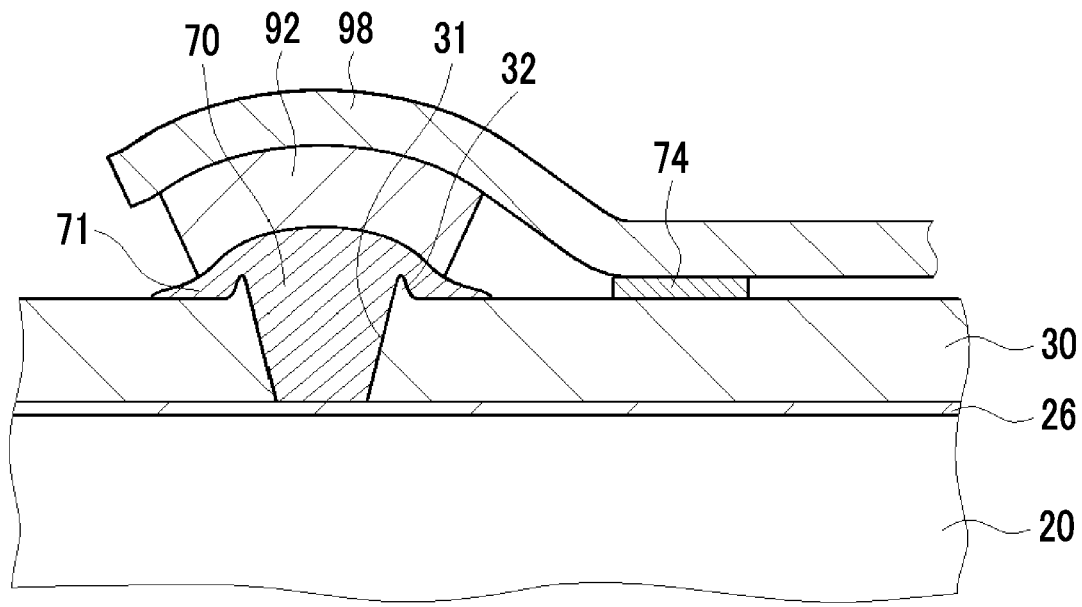
FIG. 24 is a partially enlarged sectional view of another example of the piezoelectric element of the present invention.
Figure 25:
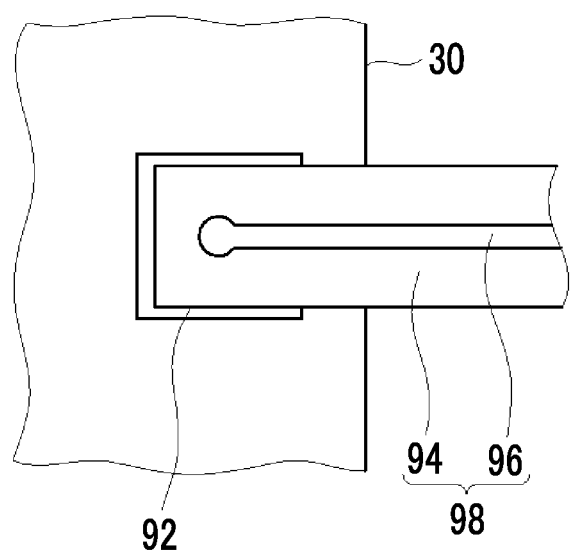
FIG. 25 is a top view of FIG. 24.

In addition, the examples illustrated in FIGS. 24 and 25 are examples in which the conductor 92 and a printed wire sheet 98 are provided as the conductive member. As illustrated in FIG. 25, the printed wire sheet 98 has the wire 96 printed on an insulating substrate 94 such as a plastic sheet. The wire 96 of the printed wire sheet 98 is connected to the conductor 92.

The conductor 92 is only connected on the filling member 70 and is not fixed to the upper protective layer 30 and the like. The printed wire sheet 98 is fixed to the upper protective layer 30 by the fixing member 74.

As described above, the conductive member may be a combination of a plurality of conductive members. In this case, at least one of the members constituting the conductive member may be fixed to a predetermined portion by the fixing member 74.

In addition, a conductive member such as a conductive wire may be further connected to the conductive member 72 consisting of a conductive sheet. In addition, the conductive member such as the conductive wire may be connected to any position of the conductive member 72.

Figure 26:
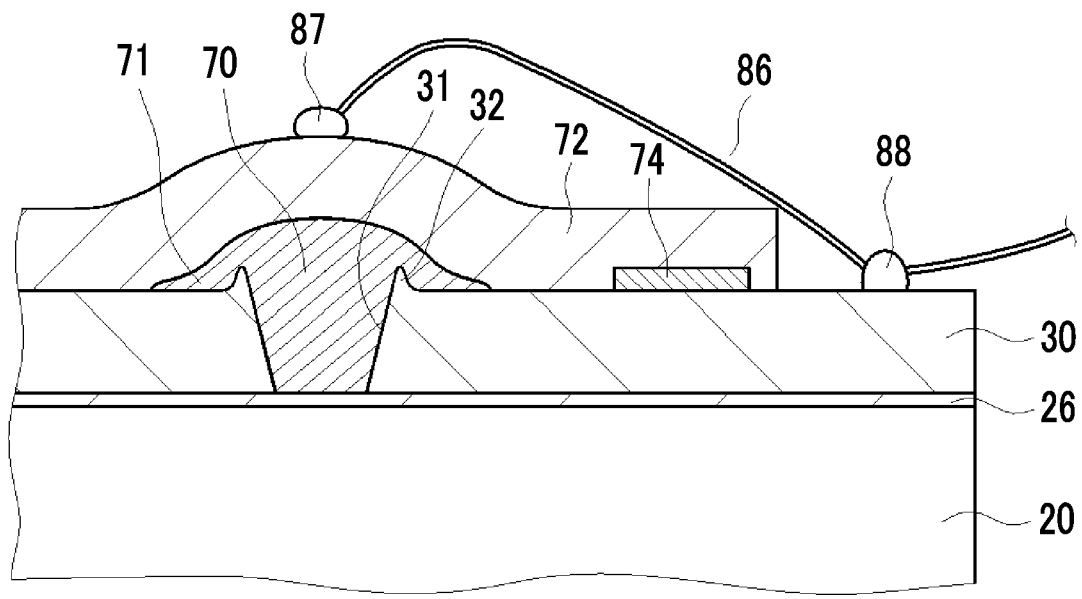
FIG. 26 is a partially enlarged sectional view of another example of the piezoelectric element of the present invention.

For example, in the example illustrated in FIG. 26, the conductive wire 86 is fixed by the solder 87 to a surface side of the conductive member 72 consisting of a conductive sheet at a position connected to the filling member 70. The conductive wire 86 is fixed to the upper protective layer 30 by an adhesive member 88 at a position in the middle of an extending direction.

In a case of the configuration illustrated in FIG. 26, the conductive member 72, the solder 87, and the conductive wire 86 can be said to be the conductive member in the present invention, and the adhesive member 88 can be said to be the fixing member in the present invention.

Figure 27:
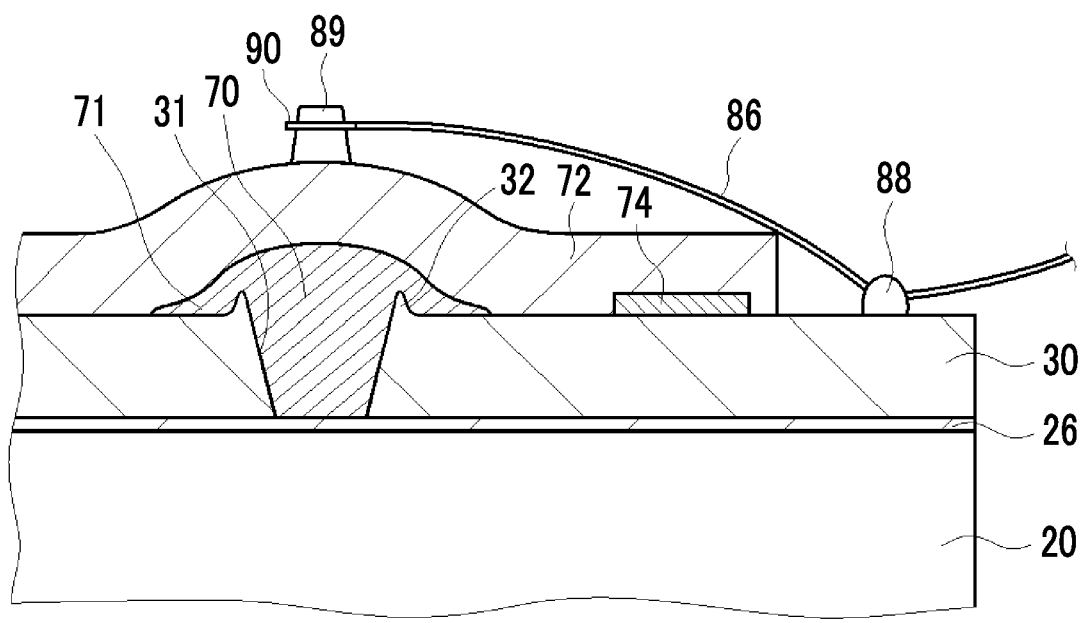
FIG. 27 is a partially enlarged sectional view of another example of the piezoelectric element of the present invention.

In the example illustrated in FIG. 27, on the surface side of a position connected to the filling member 70 of the conductive member 72 consisting of a conductive sheet, a conductive column 90 is provided and a conductive wire 86 having a socket 89 that fits into the column at a tip is connected. The conductive wire 86 is fixed to the upper protective layer 30 by an adhesive member 88 at a position in the middle of an extending direction.

In a case of the configuration illustrated in FIG. 27, it can be said that the conductive member 72, a column 90, the socket 89, and the conductive wire 86 are conductive members in the present invention, and the adhesive member 88 is the fixing member in the present invention.

Here, in the example illustrated in FIG. 2, the conductive member 72 electrically connected to the upper electrode 26 via the filling member 70 on the upper protective layer 30 side and the conductive member 72 electrically connected to the lower electrode 24 via the filling member 70 on the lower protective layer 28 side are arranged so that positions in the surface direction do not overlap with each other as preferable aspects. With this, it is possible to suppress the conductive member 72 on the upper electrode 26 side and the conductive member 72 on the lower electrode 24 side from coming into contact with each other to cause a short circuit.

As an example, such piezoelectric element 10 is used to generate (reproduce) sound due to vibration in response to an electrical signal, or convert vibration due to sound into an electrical signal in various audio devices (audio equipment) such as pickups used in musical instruments such as speakers, microphones, and guitars.

In addition, the piezoelectric element can also be used in pressure-sensitive sensors, power generation elements, and the like, in addition to these.

In addition, for example, in a case where the piezoelectric element 10 is used for a speaker, the piezoelectric element 10 may be used as the one that generates sound by the vibration of the film-shaped piezoelectric element 10 itself. Alternatively, the piezoelectric element 10 may be used as an exciter that is attached to a vibration plate, vibrates the vibration plate due to vibration of the piezoelectric element 10, and generates sound.

Hereinafter, each constituent element of the piezoelectric element of the embodiment of the present invention will be described in detail.

[Piezoelectric Layer]

The piezoelectric layer 20 may be a layer consisting of a known piezoelectric body. In the present invention, the piezoelectric layer 20 is preferably a polymer composite piezoelectric body containing piezoelectric particles 36 in a matrix 34 including a polymer material.

As the material of the matrix 34 (serving as a matrix and a binder) of the polymer composite piezoelectric body constituting the piezoelectric layer 20, a polymer material having viscoelasticity at room temperature is preferably used.

The piezoelectric element 10 of the embodiment of the present invention is suitably used for a speaker having flexibility such as a speaker for a flexible display. Here, it is preferable that the polymer composite piezoelectric body (piezoelectric layer 20) used for a speaker having flexibility satisfies the following requisites. Accordingly, it is preferable to use a polymer material having a viscoelasticity at room temperature as a material satisfying the following requirements.

Furthermore, in the present specification, the "room temperature" indicates a temperature range of approximately 0° C. to 50° C.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. In this case, in a case where the polymer composite piezoelectric body is hard, large bending stress is generated to that extent, and a crack is generated at the interface between the matrix and the piezoelectric particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

A speaker vibrates the piezoelectric particles at a frequency of an audio band of 20 Hz to 20 kHz, and the vibration energy causes the entire polymer composite piezoelectric body (piezoelectric element) to vibrate integrally such that a sound is reproduced. Therefore, in order to increase a transmission efficiency of the vibration energy, the polymer composite piezoelectric body is required to have appropriate hardness. In addition, in a case where frequency properties of the speaker are smooth, an amount of change in acoustic quality in a case where the lowest resonance frequency is changed in association with a change in the curvature decreases. Therefore, the loss tangent of the polymer composite piezoelectric body is required to be suitably large.

As described above, a polymer composite piezoelectric body is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 20), the polymer material of which the glass transition point is room temperature, in other words, the polymer material having viscoelasticity at room temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of suitably exhibiting such behavior, it is preferable that a polymer material of which the glass transition temperature at a frequency of 1 Hz is room temperature, that is, 0° C. to 50° C. is used in the matrix of the polymer composite piezoelectric body.

As the polymer material having viscoelasticity at room temperature, various known materials are able to be used as long as the material has dielectric properties. Preferably, a polymer material of which the maximum value of a loss tangent at a frequency of 1 Hz at room temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the matrix and the piezoelectric particles at the maximum bending moment portion is relieved, and thus good flexibility is obtained.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated in a case where the polymer composite piezoelectric body is slowly bent due to the external force, and it is possible to make the polymer composite piezoelectric body rigid with respect to an acoustic vibration of 20 Hz to 20 kHz.

In addition, it is more suitable that the relative permittivity of the polymer material is greater than or equal to 10 at 25° C. Accordingly, in a case where a voltage is applied to the polymer composite piezoelectric body, a higher electric field is applied to the piezoelectric particles in the matrix, and thus a large deformation amount can be expected.

However, in consideration of securing good moisture resistance or the like, it is suitable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, as the polymer material, a material having a cyanoethyl group is preferably used, and cyanoethylated PVA is particularly preferably used.

Furthermore, only one of these polymer materials may be used, or a plurality of types thereof may be used in combination (mixture).

The matrix 34 using such a polymer material, as necessary, may use a plurality of polymer materials in combination.

That is, in order to control dielectric properties or mechanical properties, other dielectric polymer materials may be added to the matrix 34 in addition to the polymer material having viscoelasticity at room temperature, as necessary.

As the dielectric polymer material which is able to be added to the viscoelastic matrix, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, and a synthetic rubber such as nitrile rubber or chloroprene rubber are exemplified.

Among them, a polymer material having a cyanoethyl group is suitably used.

Furthermore, the dielectric polymer material added to the matrix 34 of the piezoelectric layer 20 in addition to the polymer material having viscoelasticity at room temperature such as cyanoethylated PVA is not limited to one dielectric polymer, and a plurality of dielectric polymers may be added.

In addition, for the purpose of controlling the glass transition point, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added to the matrix 34 in addition to the dielectric polymer material.

Furthermore, for the purpose of improving adhesiveness, a viscosity imparting agent such as rosin ester, rosin, terpene, terpene phenol, and a petroleum resin may be added.

The amount of materials added to the matrix 34 of the piezoelectric layer 20 in a case where materials other than the polymer material having viscoelasticity such as cyanoethylated PVA is not particularly limited, and it is preferable that a ratio of the added materials to the matrix 34 is less than or equal to 30 mass %.

Accordingly, it is possible to exhibit properties of the polymer material to be added without impairing the viscoelasticity relieving mechanism of the matrix 34, and thus a preferable result is able to be obtained from a viewpoint of increasing a dielectric constant, of improving heat resistance, and of improving adhesiveness between the piezoelectric particles 36 and the electrode layer.

The piezoelectric layer 20 is a polymer composite piezoelectric body including the piezoelectric particles 36 in such a matrix 34.

The piezoelectric particles 36 consist of ceramics particles having a perovskite type or wurtzite type crystal structure.

As the ceramics particles forming the piezoelectric particles 36, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified.

Only one of these piezoelectric particles 36 may be used, or a plurality of types thereof may be used in combination (mixture).

The particle diameter of the piezoelectric particles 36 is not limited, and may be appropriately selected depending on the size and the usage of the polymer composite piezoelectric body (piezoelectric element 10).

The particle diameter of the piezoelectric particles 36 is preferably 1 to 10 µm. By setting the particle diameter of the piezoelectric particles 36 to be in the range described above, a preferable result is able to be obtained from a viewpoint of allowing the polymer composite piezoelectric body (piezoelectric element 10) to achieve both high piezoelectric properties and flexibility.

In FIG. 1, the piezoelectric particles 36 in the piezoelectric layer 20 are uniformly dispersed in the matrix 34 with regularity, but the present invention is not limited thereto.

That is, in the matrix 34, the piezoelectric particles 36 in the piezoelectric layer 20 are preferably uniformly dispersed, and may also be irregularly dispersed.

In the piezoelectric layer 20 (polymer composite piezoelectric body), a quantitative ratio of the matrix 34 and the piezoelectric particles 36 in the piezoelectric layer 20 is not limited, and may be appropriately set according to the size in the surface direction or the thickness of the piezoelectric layer 20, the usage of the polymer composite piezoelectric body, properties required for the polymer composite piezoelectric body, and the like.

The volume fraction of the piezoelectric particles 36 in the piezoelectric layer 20 is set to preferably 30% to 80%, more preferably more than or equal to 50%, and therefore even more preferably 50% to 80%.

By setting the quantitative ratio of the matrix 34 and the piezoelectric particles 36 to be in the range described above, it is possible to obtain a preferable result from a viewpoint of making high piezoelectric properties and flexibility compatible.

The thickness of the piezoelectric layer 20 is not limited, and may be appropriately set according to the usage of the polymer composite piezoelectric body, properties required for the polymer composite piezoelectric body, and the like. The thicker the piezoelectric layer 20, the more advantageous it is in terms of rigidity such as the stiffness of a so-called sheet-like material, but the voltage (potential difference) required to stretch and contract the piezoelectric layer 20 by the same amount increases.

The thickness of the piezoelectric layer 20 is preferably 10 to 300 µm, more preferably 20 to 200 µm, and even more preferably 30 to 150 µm.

By setting the thickness of the piezoelectric layer 20 to be in the range described above, it is possible to obtain a preferable result from a viewpoint of compatibility between securing the rigidity and appropriate flexibility, or the like.

[Electrode Layer and Protective Layer]

As illustrated in FIG. 1, the piezoelectric element 10 of the illustrated example has a configuration in which the lower electrode 24 is provided on one surface of the piezoelectric layer 20, the lower protective layer 28 is provided on the surface thereof, the upper electrode 26 is provided on the other surface of the piezoelectric layer 20, and the upper protective layer 30 is provided on the surface thereof. Here, the upper electrode 26 and the lower electrode 24 form an electrode pair.

That is, the piezoelectric element 10 has a configuration in which both surfaces of the piezoelectric layer 20 are interposed between the electrode pair, that is, the upper electrode 26 and the lower electrode 24 and the laminate is further interposed between the lower protective layer 28 and the upper protective layer 30.

As described above, in the piezoelectric element 10, the region interposed between the upper electrode 26 and the lower electrode 24 is stretched and contracted according to an applied voltage.

The lower protective layer 28 and the upper protective layer 30 have a function of covering the upper electrode 26 and the lower electrode 24 and applying appropriate rigidity and mechanical strength to the piezoelectric layer 20. That is, there may be a case where, in the piezoelectric element 10, the piezoelectric layer 20 consisting of the matrix 34 and the piezoelectric particles 36 exhibits extremely superior flexibility under bending deformation at a slow vibration but has insufficient rigidity or mechanical strength depending on the usage. As a compensation for this, the piezoelectric element 10 is provided with the lower protective layer 28 and the upper protective layer 30.

The lower protective layer 28 and the upper protective layer 30 are not limited, and may use various sheet-like materials. As an example, various resin films are suitably exemplified.

Among them, by the reason of excellent mechanical properties and heat resistance, a resin film consisting of polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), or a cyclic olefin-based resin is suitably used.

There is also no limitation on the thicknesses of the lower protective layer 28 and the upper protective layer 30. In addition, the thicknesses of the lower protective layer 28 and the upper protective layer 30 may basically be identical to each other or different from each other.

Here, in a case where the rigidity of the lower protective layer 28 and the upper protective layer 30 is too high, not only is the stretching and contracting of the piezoelectric layer 20 constrained, but also the flexibility is impaired. Therefore, it is advantageous in a case where the thicknesses of the lower protective layer 28 and the upper protective layer 30 are smaller unless mechanical strength or good handleability as a sheet-like material is required.

The thickness of the lower protective layer 28 and the upper protective layer 30 is preferably 3 µm to 100 µm, more preferably 3 µm to 50 µm, even more preferably 3 µm to 30 µm, and particularly preferably 4 µm to 10 µm.

Here, in the piezoelectric element 10, in a case where the thickness of the lower protective layer 28 and the upper protective layer 30 is less than or equal to twice the thickness of the piezoelectric layer 20, it is possible to obtain a preferable result from a viewpoint of compatibility between securing the rigidity and appropriate flexibility, or the like.

For example, in a case where the thickness of the piezoelectric layer 20 is 50 µm and the lower protective layer 28 and the upper protective layer 30 consist of PET, the thickness of the lower protective layer 28 and the upper protective layer 30 is preferably less than or equal to 100 µm, more preferably less than or equal to 50 µm, and even more preferably less than or equal to 25 µM.

In the piezoelectric element 10, the lower electrode 24 is formed between the piezoelectric layer 20 and the lower protective layer 28, and the upper electrode 26 is formed between the piezoelectric layer 20 and the upper protective layer 30.

The lower electrode 24 and the upper electrode 26 are provided to apply a driving voltage to the piezoelectric layer 20.

In the present invention, a forming material of the lower electrode 24 and the upper electrode 26 is not limited, and various conductors are able to be used. Specifically, metals such as carbon, palladium, iron, tin, aluminum, nickel, platinum, gold, silver, copper, titanium, chromium, and molybdenum, alloys thereof, laminates and composites of these metals and alloys, indium-tin oxide, and the like are exemplified. Among them, copper, aluminum, gold, silver, platinum, and indium-tin oxide are suitably exemplified as the lower electrode 24 and the upper electrode 26.

In addition, a forming method of the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above are able to be used.

Among them, in particular, by the reason that the flexibility of the piezoelectric element 10 is able to be secured, a thin film made of copper, aluminum, or the like formed by using the vacuum vapor deposition is suitably used as the lower electrode 24 and the upper electrode 26. Among them, in particular, the copper thin film formed by using the vacuum vapor deposition is suitably used.

There is no limitation on the thickness of the lower electrode 24 and the upper electrode 26. In addition, the thicknesses of the lower electrode 24 and the upper electrode 26 may basically be identical to each other or different from each other.

Here, similarly to the lower protective layer 28 and upper protective layer 30 mentioned above, in a case where the rigidity of the lower electrode 24 and the upper electrode 26 is too high, not only is the stretching and contracting of the piezoelectric layer 20 constrained, but also the flexibility is impaired. Therefore, it is advantageous in a case where the thicknesses of the lower electrode 24 and the upper electrode 26 are smaller as long as electrical resistance is not excessively high. That is, it is preferable that the lower electrode 24 and the upper electrode 26 are thin film electrodes.

The thickness of the lower electrode 24 and the upper electrode 26 is thinner than that of the protective layer, is preferably 0.05 µm to 10 µm, more preferably 0.05 µm to 5 µm, even more preferably 0.08 µm to 3 µm, and particularly preferably 0.1 µm to 2 µm.

Here, in the piezoelectric element 10, in a case where the product of the thicknesses of the lower electrode 24 and the upper electrode 26 and the Young's modulus is less than the product of the thicknesses of the lower protective layer 28 and the upper protective layer 30 and the Young's modulus, the flexibility is not considerably impaired, which is suitable.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), in a case where the thickness of the lower protective layer 28 and the upper protective layer 30 is 25 µm, the thickness of the lower electrode 24 and the upper electrode 26 is preferably less than or equal to 1.2 µm, more preferably less than or equal to 0.3 µm, and particularly preferably less than or equal to 0.1 µm.

In the piezoelectric element 10, it is preferable that the maximum value of the loss tangent (Tan δ) at a frequency of 1 Hz according to the dynamic viscoelasticity measurement exists at room temperature, and it is more preferable that a maximum value of greater than or equal to 0.1 exists at room temperature.

Accordingly, even in a case where the piezoelectric element 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the matrix and the piezoelectric particles.

In the piezoelectric element 10, it is preferable that the storage elastic modulus (E') at a frequency of 1 Hz according to the dynamic viscoelasticity measurement is 10 GPa to 30 GPa at 0° C., and 1 GPa to 10 GPa at 50° C. Regarding this condition, the same applies to the piezoelectric layer 20.

Accordingly, the piezoelectric element 10 is able to have large frequency dispersion in the storage elastic modulus (E'). That is, the piezoelectric element 10 is able to be rigid with respect to a vibration of 20 Hz to 20 kHz, and is able to be flexible with respect to a vibration of less than or equal to a few Hz.

In addition, in the piezoelectric element 10, it is preferable that the product of the thickness and the storage elastic modulus (E') at a frequency of 1 Hz according to the dynamic viscoelasticity measurement is $1.0 \times 10^5$ to $2.0 \times 10^6$ (1.0E+05 to 2.0E+06)N/m at 0° C., and $1.0 \times 10^5$ to $1.0 \times 10^6$ (1.0E+05 to 1.0E+06)N/m at 50° C. Regarding this condition, the same applies to the piezoelectric layer 20.

Accordingly, the piezoelectric element 10 is able to have appropriate rigidity and mechanical strength within a range not impairing the flexibility and the acoustic properties.

Furthermore, in the piezoelectric element 10, it is preferable that the loss tangent at a frequency of 1 kHz at 25° C. is greater than or equal to 0.05 in a master curve obtained by the dynamic viscoelasticity measurement. Regarding this condition, the same applies to the piezoelectric layer 20.

Accordingly, the frequency properties of a speaker using the piezoelectric element 10 are smoothened, and thus it is also possible to decrease the changed amount of acoustic quality in a case where the lowest resonance frequency $f_0$ is changed according to a change in the curvature of the speaker.

In the present invention, the storage elastic modulus (Young's modulus) and the loss tangent of the piezoelectric element 10, the piezoelectric layer 20, and the like may be measured by a known method. As an example, the measurement may be performed using a dynamic viscoelasticity measuring device DMS6100 (manufactured by SII Nanotechnology Inc.).

Examples of the measurement conditions include a measurement frequency of 0.1 Hz to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

[Filling Member]

The filling member 70 is made by curing a liquid conductive material.

As the conductive material used as the filling member 70, silver paste, metal nanoparticle ink (Ag, Au), and the like can be used.

The viscosity of the conductive material is preferably 10 mPa·s (millipascal seconds) to 20 Pa·s (pascal seconds), more preferably 0.1 Pa·s to 15 Pa·s, and even more preferably 0.5 Pa·s to 10 Pa·s.

The specific resistance of the filling member 70 after curing is preferably $1 \times 10^{-6}$ (Ω·cm) to $1 \times 10^{-3}$ (Ω·cm), more preferably $1 \times 10^{-6}$ (Ω·cm) to $8 \times 10^{-4}$ (Ω·cm), and even more preferably $1 \times 10^{-6}$ (Ω·cm) to $1 \times 10^{-4}$ (Ω·cm).

[Conductive Member]

(Conductive Sheet)

The conductive sheet used as the conductive member 72 is a sheet-like material formed of a metal material having conductivity such as copper foil. Copper, aluminum, gold, silver, and the like are suitably exemplified as the material of the conductive sheet.

In addition, the shape of the conductive sheet is not particularly limited, but as described above, the shape is preferably a long shape. In addition, the size of the conductive sheet is not particularly limited as long as it can cover the filling member 70.

(Conductor)

As described above, the conductive member 72 may have a configuration of including a conductor and a conductive wire or a conductive sheet connected to the conductor.

Copper, aluminum, gold, silver, brass, and the like are suitably exemplified as the material of the conductor.

In addition, the shape and size of the conductor are not particularly limited, and may be any shape and size that can be connected to the filling member 70 and connected to the conductive sheet or the conductive wire.

(Conductive Wire)

The conductive wire is a wire consisting of a conductive material such as copper, aluminum, gold, and silver.

The diameter and length of the conductive wire are not particularly limited as long as the conductive wire is connected to the conductor and can be reliably connected electrically.

[Fixing Member and Second Fixing Member]

As the fixing member and the second fixing member, various adhesive materials, bonding materials, double-sided tapes, and bonding tapes can be used as long as the conductive member and the protective layer can be fixed.

As described above, the fixing member and the second fixing member may be a so-called adhesive layer provided between the conductive member and the protective layer, or may be a so-called adhesive sheet that is fixed to the protective layer from above the conductive member.

Next, an example of a manufacturing method of the piezoelectric element 10 will be described with reference to FIGS. 14 to 19.

Figure 14:
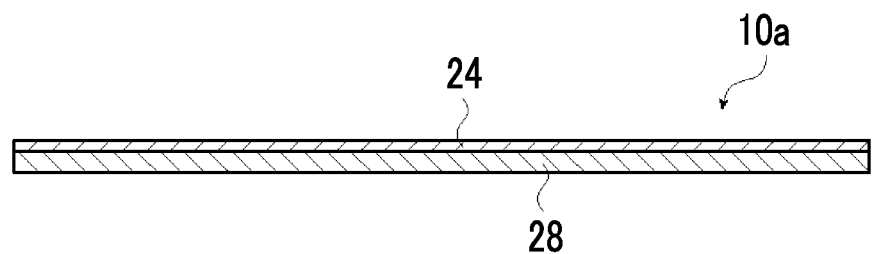
FIG. 14 is a conceptual view for describing an example of a method of preparing a piezoelectric element.

First, as illustrated in FIG. 14, a sheet-like material 10a is prepared in which the lower electrode 24 is formed on the lower protective layer 28. The sheet-like material 10a may be produced by forming a copper thin film or the like as the lower electrode 24 on the surface of the lower protective layer 28 using vacuum vapor deposition, sputtering, plating, or the like.

In a case where the lower protective layer 28 is extremely thin, and thus the handleability is degraded, a lower protective layer 28 with a separator (temporary support) may be used as necessary. As the separator, a PET film having a thickness of 25 μm to 100 μm, and the like are able to be used. The separator may be removed after thermal compression bonding of the upper electrode 26 and the upper protective layer 30 and before laminating any member on the lower protective layer 28.

On the other hand, a coating material is prepared by dissolving a polymer material as a material of a matrix in an organic solvent, adding the piezoelectric particles 36 such as PZT particles thereto, and stirring and dispersing the resultant product.

The organic solvent is not limited, and various organic solvents are able to be used.

Figure 15:
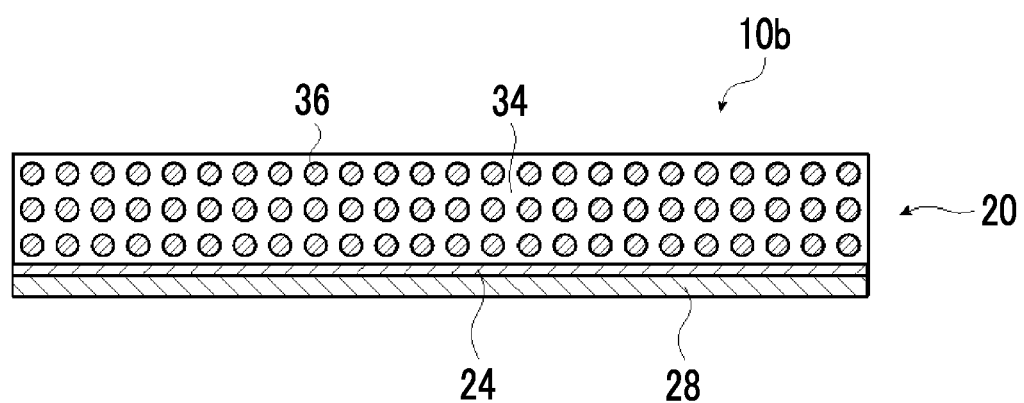
FIG. 15 is a conceptual view for describing an example of a method of preparing a piezoelectric element.

In a case where the sheet-like material 10a is prepared and the coating material is prepared, the coating material is cast (applied) onto the sheet-like material 10a, and the organic solvent is evaporated and dried. Accordingly, as illustrated in FIG. 15, a laminate 10b in which the lower electrode 24 is provided on the lower protective layer 28 and the piezoelectric layer 20 is formed on the lower electrode 24 is produced. The lower electrode 24 refers to an electrode on the base material side in a case where the piezoelectric layer 20 is applied, and does not indicate the vertical positional relationship in the laminate.

A casting method of the coating material is not particularly limited, and all known methods (coating devices) such as a slide coater or a doctor knife are able to be used.

As described above, in the piezoelectric element 10, in addition to the viscoelastic material such as cyanoethylated PVA, a dielectric polymer material may be added to the matrix 34.

In a case where the polymer material is added to the matrix 34, the polymer material added to the above-mentioned coating material may be dissolved.

After the laminate 10b in which the lower electrode 24 is provided on the lower protective layer 28 and the piezoelectric layer 20 is formed on the lower electrode 24 is produced, the piezoelectric layer 20 is preferably subjected to polarization processing (poling).

A polarization processing method of the piezoelectric layer 20 is not limited, and a known method is able to be used.

Before the polarization processing, calender processing may be performed to smoothen the surface of the piezoelectric layer 20 using a heating roller or the like. By performing the calender processing, a thermal compression bonding process described below is able to be smoothly performed.

In this way, while the piezoelectric layer 20 of the laminate 10b is subjected to the polarization processing, a sheet-like material 10c is prepared in which the upper electrode 26 is formed on the upper protective layer 30. This sheet-like material 10c may be produced by forming a copper thin film or the like as the upper electrode 26 on the surface of the upper protective layer 30 using vacuum vapor deposition, sputtering, plating, or the like.

Figure 16:
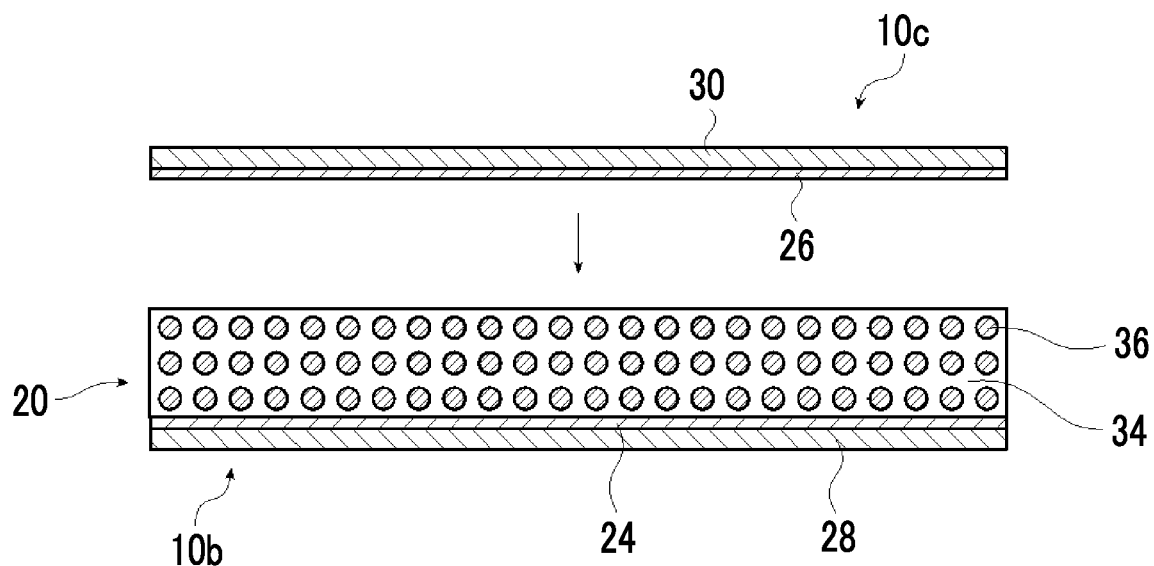
FIG. 16 is a conceptual view for describing an example of a method of preparing a piezoelectric element.

Next, as illustrated in FIG. 16, the sheet-like material 10c is laminated on the laminate 10b in which the piezoelectric layer 20 is subjected to the polarization processing while the upper electrode 26 faces the piezoelectric layer 20.

Furthermore, a laminate of the laminate 10b and the sheet-like material 10c is interposed between the upper protective layer 30 and the lower protective layer 28, and is subjected to the thermal compression bonding using a heating press device, a heating roller pair, or the like.

By the above steps, a laminate in which an electrode layer and a protective layer are laminated on both surfaces of the piezoelectric layer 20 is produced. The produced laminate may be cut into a desired shape according to various usages.

Such a laminate may be produced using a cut sheet-like material, or may be produced by roll-to-roll (hereinafter, also referred to as RtoR).

Next, a hole is provided in the protective layer of the laminate, a filling member is formed in the hole, and the conductive member is installed on the filling member.

Figure 17:
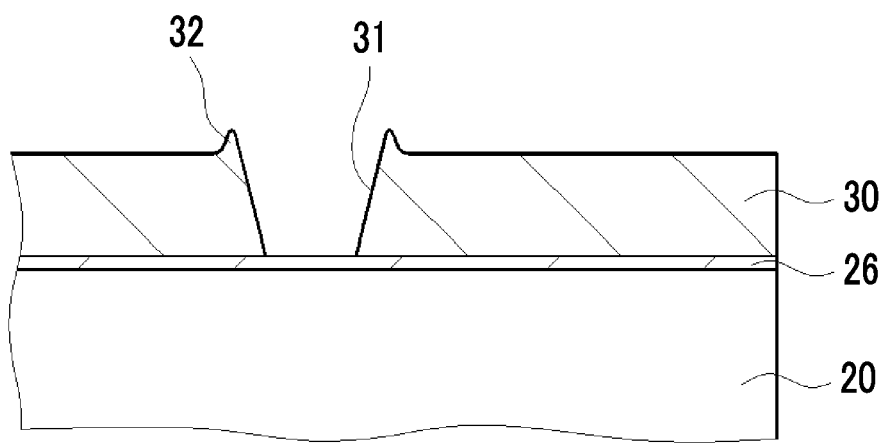
FIG. 17 is a conceptual view for describing an example of a method of preparing a piezoelectric element.

Specifically, first, as illustrated in FIG. 17, a hole 31 is formed in the upper protective layer 30.

The hole 31 is formed by a method of laser processing (carbon dioxide laser, and the like), a method of making a cut in the protective layer in the depth direction (for example, the thickness of the protective layer is 10 μm and the thickness of the electrode layer is 2 μm, the protective layer is formed by making a circular cut from 8 to 9.5 μm in the thickness direction of the protective layer and then peeling off the circular portion) by press processing to peel off the protective layer, and the like.

In addition, during processing, the convex portion 32 may be formed by forcibly deforming the protective layer by applying heat or an external force in the outward direction to the peripheral edge portion of the hole.

In addition, the recess portion 33 may be formed around the hole 31 by laser machining or the like after processing of the hole 31, or before the processing.

Here, in a case where the hole 31 is formed by laser processing, the laser is scanned to form a hole having a desired opening shape. At that time, in a case where the opening shape of the hole is circular, the laser can be scanned spirally from the center to the outside or from the outside to the center, and thus the heat generated by the laser processing is hardly retained and the decrease in the strength of the electrode layer can be suppressed.

In a case where a plurality of holes are provided, assuming that the total area of the holes is the same, the heat generated by the laser processing is hardly retained in a case of providing a plurality of holes compared to a case of providing one hole, and thus it is preferable since the decrease in the strength of the electrode layer can be suppressed.

In addition, the distance between the scanning lines of the laser during laser processing may be different between the center side and the outer side of the hole. By making the distance between the scanning lines of the laser different between the center side and the outer side of the hole, as described above, the residual amount of the protective layer in the central portion and the residual amount of the protective layer in the peripheral portion can be adjusted.

In addition, by adjusting the distance between the scanning lines of the laser to be different between the center side and the outer side of the hole, it is possible to reduce the size of the gap portion generated between the electrode layer and the piezoelectric layer as described above.

In addition, during laser processing, a hole having a large diameter may be formed halfway in the thickness direction of the protective layer, and then a hole having a small diameter may be formed in a portion of a remaining thickness to the electrode layer. With this, the circle equivalent diameter is gradually changed as in the above-mentioned FIG. 8, and a configuration in which the circle equivalent diameter on the electrode layer side is smaller than the circle equivalent diameter on the conductive member side can be made.

Figure 18:
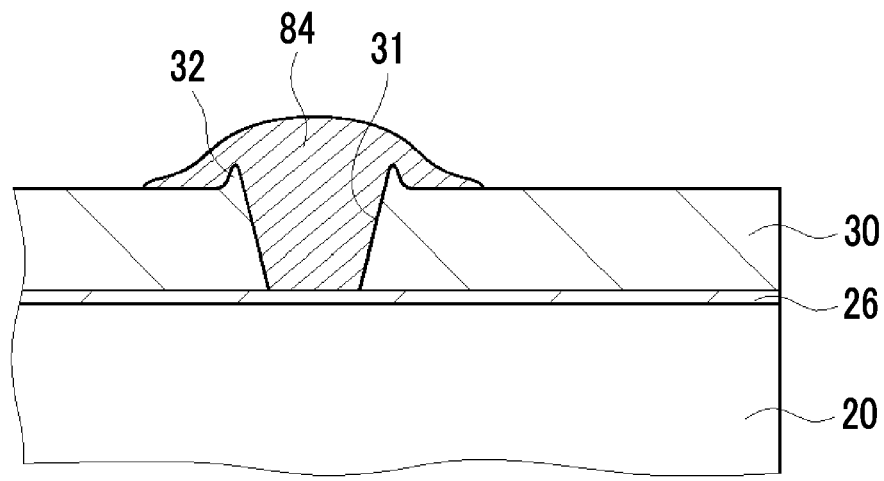
FIG. 18 is a conceptual view for describing an example of a method of preparing a piezoelectric element.

After the hole 31 is provided in the protective layer, the liquid conductive material 84 is applied to the hole 31 as illustrated in FIG. 18. At the time of coating, the conductive material 84 is applied so as to protrude from the hole 31.

As a method for applying the conductive material 84, silk screen printing, dripping with a dispenser, application with a brush, or the like can be used.

Figure 19:
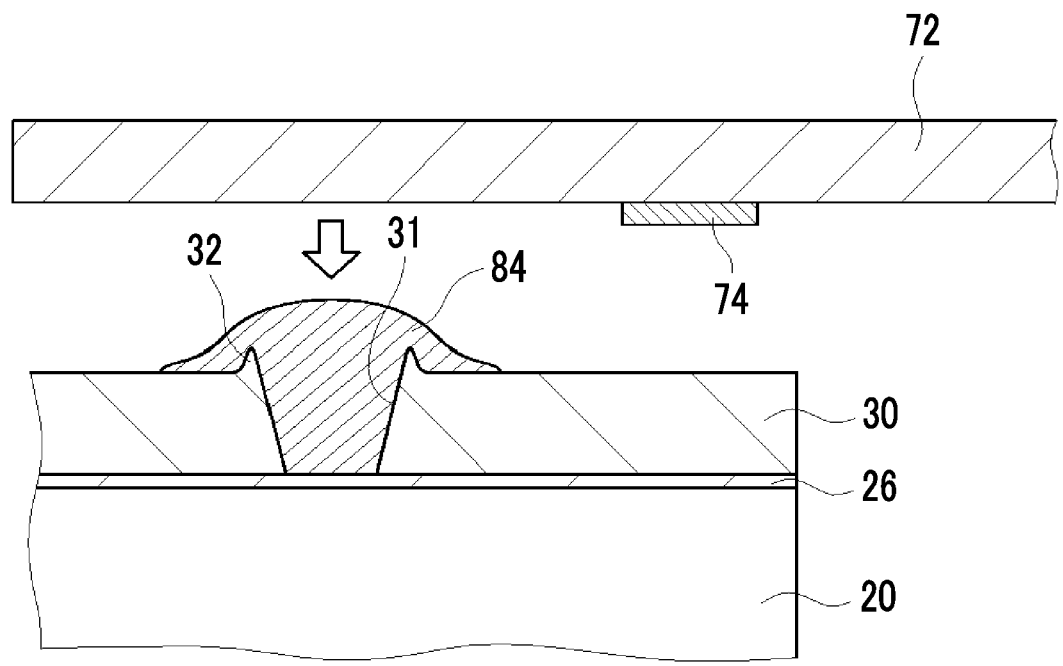
FIG. 19 is a conceptual view for describing an example of a method of preparing a piezoelectric element.

After the conductive material 84 is applied to the hole 31, the conductive member 72 is placed on the conductive material 84 as illustrated in FIG. 19. That is, the conductive member 72 is placed so as to cover the conductive material 84 before the conductive material 84 is cured.

Here, as illustrated in FIG. 19, a fixing member 74 is adhered to the surface of the conductive member 72 on the upper protective layer 30 side, the conductive member 72 is placed on the conductive material 84, and the conductive member 72 is fixed to the upper protective layer 30. This makes it possible to prevent the conductive member 72 from being displaced in a state of the conductive material 84 being uncured. In addition, by covering the conductive material 84 with the conductive member 72, it is possible to prevent the conductive material 84 from moving from above the hole 31, and to make the filling member 70 to be reliably present in the hole 31.

After the conductive member 72 is placed on the conductive material 84, the conductive material 84 is cured to form the filling member 70.

A method of curing the conductive material 84 may be performed by a method according to the conductive material 84. For example, as the method of curing the conductive material 84, heat drying and the like can be exemplified.

The piezoelectric element of the embodiment of the present invention is manufactured by the above steps.

In a case where a voltage is applied to the lower electrode 24 and the upper electrode 26 of such a piezoelectric element 10, the piezoelectric particles 36 stretch and contract in the polarization direction according to the applied voltage. As a result, the piezoelectric element 10 (piezoelectric layer 20) contracts in the thickness direction. At the same time, the piezoelectric element 10 stretches and contracts in the in-plane direction due to the Poisson's ratio. The degree of stretching and contracting is about 0.01% to 0.1%. In the in-plane direction, those that stretch and contract isotropically in all directions are as described above.

As described above, the thickness of the piezoelectric layer 20 is preferably about 10 to 300 μm. Therefore, the degree of stretching and contracting in the thickness direction is as very small as about 0.3 μm at the maximum.

Contrary to this, the piezoelectric element 10, that is, the piezoelectric layer 20, has a size much larger than the thickness in the surface direction. Therefore, for example, in a case where the length of the piezoelectric element 10 is 20 cm, the piezoelectric element 10 stretches and contracts by a maximum of about 0.2 mm as a voltage is applied.

In addition, in a case where a pressure is applied to the piezoelectric element 10, electric power is generated by the action of the piezoelectric particles 36.

By using this, the piezoelectric element 10 can be used for various usages such as a speaker, a microphone, and a pressure-sensitive sensor, as described above.

Here, it is known that in a case where a general piezoelectric element consisting of a polymer material such as PVDF has in-plane anisotropy in the piezoelectric properties, and has anisotropy in the amount of stretching and contracting in the surface direction in a case where a voltage is applied.

Contrary to this, the piezoelectric layer consisting of a polymer composite piezoelectric body containing piezoelectric particles in a matrix including a polymer material has no in-plane anisotropy in the piezoelectric properties, and stretches and contracts isotropically in all directions in the surface direction.

According to the piezoelectric element 10 that stretches and contracts isotropically and two-dimensionally, compared to a case where a general piezoelectric element made of PVDF or the like that stretch and contract greatly in only one direction is laminated, the vibration can occur with a large force, and a louder and more beautiful sound can be generated.

In the example illustrated in FIG. 1, the configuration is such that one piezoelectric element 10 is provided, but the present invention is not limited to this, and a plurality of piezoelectric elements 10 of the embodiment of the present invention may be laminated. In addition, the piezoelectric element 10 of the embodiment of the present invention may have a long shape and may be folded back once or more, preferably a plurality of times in the longitudinal direction to form a stack of a plurality of layers of the piezoelectric element 10.

Hereinabove, while the piezoelectric element of the embodiment of the present invention have been described in detail, the present invention is not limited to the examples described above, and various improvements or modifications may be naturally performed within a range not deviating from the gist of the present invention.

The piezoelectric element can be suitably used for various usages such as audio equipment including speakers and microphones and pressure-sensitive sensors.

EXPLANATION OF REFERENCES

10: piezoelectric element
10a, 10c: sheet-like material
10b: laminate
20: piezoelectric layer
24: lower electrode
26: upper electrode
28: lower protective layer
30: upper protective layer
31: hole
32: convex portion
33: recess portion
34: matrix
36: piezoelectric particles
70: filling member
71: protruding portion
72: conductive member
72a, 72b: region
73: folded-back portion
74: fixing member
76: enclosing member
80: gap portion
82: second fixing member
84: conductive material
86: conductive wire
87: solder
88: adhesive member
90: column
92: conductor
94: substrate
96: wire
98: printed wire sheet
100: vibration plate

What is claimed is:

1. A piezoelectric element comprising:
   a piezoelectric layer;
   electrode layers formed on both sides of the piezoelectric layer; and
   a protective layer laminated on a surface of at least one of the electrode layers opposite to a surface on a piezoelectric layer side,
   wherein the protective layer has a hole that penetrates from a surface to at least one of the electrode layers, and
   the piezoelectric element includes a filling member made of a conductive material, which is formed from an inside of the hole to a part of the surface of the protective layer and is electrically connected to at least one of the electrode layers,
   a conductive member which covers at least a part of the filling member and is electrically connected to the filling member, and
   a fixing member for fixing the conductive member to a surface of the protective layer opposite to at least one of the electrode layers.

2. The piezoelectric element according to claim 1, wherein the conductive member is a conductive sheet.

3. The piezoelectric element according to claim 1, wherein the conductive member has a conductor connected to the filling member and a conductive wire or a conductive sheet connected to the conductor.

4. The piezoelectric element according to claim 1, wherein the protective layer has a convex portion formed on an edge portion of the hole.

5. The piezoelectric element according to claim 1, wherein a circle equivalent diameter of the hole is gradually changed in a depth direction, and a circle equivalent diameter on an electrode layer side is smaller than a circle equivalent diameter on a conductive member side.

6. The piezoelectric element according to claim 1, wherein a carbon amount on a surface of at least one of the electrode layers present in the hole is smaller in a central portion in a surface direction than that in a region other than a central portion.

7. The piezoelectric element according to claim 1, wherein a carbon amount on a surface of at least one of the electrode layers present in the hole is larger in a central portion in a surface direction than that in a region other than the central portion.

8. The piezoelectric element according to claim 1, wherein an opening shape of the hole is a circular shape.

9. The piezoelectric element according to claim 1, wherein the protective layer has a plurality of the holes, and
   a plurality of the filling members which are formed in the plurality of holes, respectively.

10. The piezoelectric element according to claim 9, wherein the plurality of filling members are connected on the surface of the protective layer.

11. The piezoelectric element according to claim 1, further comprising:
    an enclosing member that surrounds a periphery of the hole on the surface of the protective layer,
    wherein the filling member is formed at least in the enclosing member.

12. The piezoelectric element according to claim 1, wherein the protective layer has a recess portion formed in a periphery of the hole.

13. The piezoelectric element according to claim 1, wherein a thickness of the protective layer is 3 µm to 100 µm.

14. The piezoelectric element according to claim 1, wherein a thickness of at least one of the electrode layers is 0.05 µm to 10 µm.

15. The piezoelectric element according to claim 1, further comprising:

a gap portion between at least one of the electrode layers and the piezoelectric layer at a position of the hole,
wherein a difference between an average height of an interface of the piezoelectric layer, with at least one of the electrode layers at a position where the hole is not formed, and an average height of an interface of the piezoelectric layer, with at least one of the electrode layers at a position of the hole, is 25 µm or less.

16. The piezoelectric element according to claim 1, wherein the conductive member has a long shape, the conductive member has a folded-back portion that is folded back in a longitudinal direction, and
the fixing member fixes the conductive member and the protective layer in a region opposite to a connection position between the conductive member and the filling member, across the folded-back portion.

17. The piezoelectric element according to claim 1, wherein the conductive member has a long shape, the conductive member is connected to the filling member on one end portion side in a longitudinal direction, and
the fixing member is arranged at a position farther from the one end portion than the connection position between the conductive member and the filling member in the longitudinal direction of the conductive member.

18. The piezoelectric element according to claim 17, further comprising:
a second fixing member for fixing at least a part of an edge portion of a region between the one end portion of the conductive member and the fixing member, to the protective layer.

19. The piezoelectric element according to claim 1, wherein the piezoelectric layer is made of a polymer composite piezoelectric body containing piezoelectric particles in a matrix containing a polymer material.

\* \* \* \* \*